(12) United States Patent
Kim et al.

(10) Patent No.: US 12,022,681 B2
(45) Date of Patent: Jun. 25, 2024

(54) DISPLAY PANEL INCLUDING AT LEAST ONE OPENING INSIDE A DISPLAY AREA, METHOD OF MANUFACTURING THE SAME, AND ELECTRONIC APPARATUS USING THE SAME

(71) Applicant: Samsung Display Co., Ltd., Yongin-si (KR)

(72) Inventors: Kyongjun Kim, Yongin-si (KR); Chulhwan Park, Yongin-si (KR); Dongjin Lee, Yongin-si (KR); Minhwan Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 213 days.

(21) Appl. No.: 17/447,782

(22) Filed: Sep. 15, 2021

(65) Prior Publication Data
US 2022/0102678 A1 Mar. 31, 2022

(30) Foreign Application Priority Data
Sep. 29, 2020 (KR) .................. 10-2020-0127523

(51) Int. Cl.
*H10K 50/844* (2023.01)
*H10K 50/15* (2023.01)
(Continued)

(52) U.S. Cl.
CPC .......... *H10K 50/844* (2023.02); *H10K 50/15* (2023.02); *H10K 50/16* (2023.02); *H10K 50/171* (2023.02); *H10K 71/00* (2023.02)

(58) Field of Classification Search
CPC ...... H10K 50/844; H10K 50/15; H10K 50/16; H10K 50/171; H10K 71/00; H10K 50/11;
(Continued)

(56) References Cited

U.S. PATENT DOCUMENTS 8,828,845 B2   9/2014  Kang et al.
10,361,395 B2  7/2019  Kajiyama
(Continued)

FOREIGN PATENT DOCUMENTS

CN      111162195 A    5/2020
EP       3706184 A1    9/2020
(Continued)

*Primary Examiner* — Caleb E Henry
(74) *Attorney, Agent, or Firm* — Lewis Roca Rothgerber Christie LLP

(57) ABSTRACT

A display panel includes: a substrate including an opening; a plurality of light-emitting elements arranged in a display area around the opening, the plurality of light-emitting elements each including a first electrode, a second electrode, and an intermediate layer between the first electrode and the second electrode; a plurality of partition walls arranged in an intermediate area between the display area and the opening; and an encapsulation layer on the plurality of light-emitting elements, the encapsulation layer including an inorganic encapsulation layer and an organic encapsulation layer. The second electrode extends toward the intermediate area from the display area. An organic layer of the intermediate layer includes a plurality of opening portions arranged in a region from the opening to an edge portion of the second electrode facing the opening.

25 Claims, 25 Drawing Sheets

(51) Int. Cl.
*H10K 50/16* (2023.01)
*H10K 50/17* (2023.01)
*H10K 71/00* (2023.01)

(58) Field of Classification Search
CPC ...... H10K 50/82; H10K 59/121; H10K 59/00;
H10K 50/17; H10K 50/8426; H10K
77/10; Y02E 10/549
See application file for complete search history.

(56) References Cited

U.S. PATENT DOCUMENTS

| | | | |
|---|---|---|---|
| 10,564,756 B2 | 2/2020 | Lee et al. | |
| 11,322,720 B2* | 5/2022 | Zhu | H10K 59/8731 |
| 2017/0084615 A1* | 3/2017 | Lee | H10B 12/34 |
| 2017/0288004 A1* | 10/2017 | Kim | H10K 77/10 |
| 2018/0114976 A1* | 4/2018 | Lee | H01M 4/136 |
| 2019/0196661 A1* | 6/2019 | Baek | G09G 3/3225 |
| 2020/0106046 A1 | 4/2020 | Kim | |
| 2020/0144341 A1 | 5/2020 | Choi et al. | |
| 2020/0212139 A1 | 7/2020 | Baek et al. | |
| 2020/0388784 A1* | 12/2020 | Kim | H10K 50/84 |
| 2021/0111374 A1* | 4/2021 | Sung | G06F 3/0443 |
| 2022/0173187 A1* | 6/2022 | Seon | H10K 50/84 |

FOREIGN PATENT DOCUMENTS

| | | |
|---|---|---|
| JP | 2018-063388 A | 4/2018 |
| KR | 10-1337515 B1 | 12/2013 |
| KR | 10-1936060 B1 | 1/2019 |
| KR | 10-2019-0073716 A | 6/2019 |
| KR | 10-2020-0030163 A | 3/2020 |

\* cited by examiner

DISPLAY PANEL INCLUDING AT LEAST ONE OPENING INSIDE A DISPLAY AREA, METHOD OF MANUFACTURING THE SAME, AND ELECTRONIC APPARATUS USING THE SAME

CROSS-REFERENCE TO RELATED APPLICATION

This application claims priority to and the benefit of Korean Patent Application No. 10-2020-0127523, filed on Sep. 29, 2020, in the Korean Intellectual Property Office (KIPO), the entire disclosure of which is incorporated by reference herein.

BACKGROUND

1. Field

One or more embodiments relate to a display panel, a method of manufacturing the same, and an electronic apparatus using the display panel.

2. Description of Related Art

Recently, the usage of display panels has diversified. In addition, as display panels have become thinner and lighter, their range of use has gradually been extended.

As the area occupied by a display area in display panels has expanded, various functions that are combined or associated with the display panels have been added. To add various functions while expanding the area of the display panel that is occupied by the display area, research has been carried out on adding various functions, other than displaying images, to a portion of the display area.

SUMMARY

Aspects of one or more embodiments are directed towards a display panel including at least one opening inside a display area, a manufacturing method thereof, and an electronic apparatus using the display panel.

Additional aspects will be set forth in part in the description which follows and, in part, will be apparent from the description, or may be learned by practice of the presented embodiments of the disclosure.

According to one or more embodiments, a display panel includes a substrate including an opening, a plurality of light-emitting elements arranged in a display area around the opening, the plurality of light-emitting elements each including a first electrode, a second electrode, and an intermediate layer between the first electrode and the second electrode, a plurality of partition walls arranged in an intermediate area between the display area and the opening, and an encapsulation layer on the plurality of light-emitting elements, the encapsulation layer including an inorganic encapsulation layer and an organic encapsulation layer. The second electrode extends toward the intermediate area from the display area. An organic layer of the intermediate layer includes a plurality of opening portions arranged in a region from the opening to an edge portion of the second electrode facing the opening.

The organic layer may include organic portions that are separated from each other by the plurality of opening portions. Top surfaces of the organic portions may contact the inorganic encapsulation layer.

In a plan view, each of the plurality of opening portions may have a closed loop shape surrounding the opening.

At least one of the plurality of opening portions may be arranged between two neighboring partition walls from among the plurality of partition walls.

At least one of the plurality of opening portions may be arranged between the opening and a partition wall that is closest to the opening from among the plurality of partition walls.

At least one of the plurality of opening portions may be arranged between the display area and a partition wall that is closest to the display area from among the plurality of partition walls.

The organic layer may include at least one of a hole transport layer, a hole injection layer, an electron transport layer, and an electron injection layer.

The display panel may further include an inorganic insulating layer arranged over the substrate. The inorganic encapsulation layer may contact a top surface of the inorganic insulating layer through one of the plurality of opening portions.

An edge of the organic encapsulation layer may be adjacent to one of the plurality of partition walls. The inorganic encapsulation layer may include a first inorganic encapsulation layer under the organic encapsulation layer, and a second inorganic encapsulation layer on the organic encapsulation layer, the second inorganic encapsulation layer contacting the first inorganic encapsulation layer in a region between the edge of the organic encapsulation layer and the opening.

The edge portion of the second electrode may be between the display area and one of the plurality of partition walls.

The edge portion of the second electrode may be covered by the organic encapsulation layer.

The display panel may further include a plurality of inorganic insulating layers on the substrate. The plurality of inorganic insulating layers may include a plurality of grooves each having a depth less than a sum of thicknesses of the plurality of inorganic insulating layers. The plurality of grooves may overlap a cover layer including an organic insulating material.

The display panel may further include an auxiliary layer between the display area and one of the plurality of partition walls, the auxiliary layer overlapping the organic encapsulation layer.

The auxiliary layer may include a same material as the first electrode.

The display panel may further include a planarization layer on the encapsulation layer, the planarization layer overlapping the plurality of partition walls and a portion of the organic encapsulation layer.

According to one or more embodiments, an electronic apparatus includes a display panel including an opening area, a display area around the opening area, and an intermediate area between the opening area and the display area, and a component overlapping the opening area, wherein the display panel includes a substrate including an opening arranged in the opening area, a plurality of light-emitting elements arranged in the display area, each of the plurality of light-emitting elements including a first electrode, a second electrode, and an intermediate layer between the first electrode and the second electrode, a plurality of partition walls arranged in the intermediate area, and an encapsulation layer arranged on the plurality of light-emitting elements, the encapsulation layer including a first inorganic encapsulation layer, an organic encapsulation layer, and a second inorganic encapsulation layer. The second electrode extends toward the intermediate area from the display area, the second electrode including a first opening portion defined by an edge portion of the second electrode facing the opening. An organic layer of the intermediate layer includes a plurality of second opening portions arranged in a region from the edge portion of the second electrode to the opening, and a plurality of organic portions separated from each other by the plurality of second opening portions, the plurality of organic portions being arranged in the first opening portion.

Top surfaces of the plurality of organic portions may contact the first inorganic encapsulation layer.

In a plan view, each of the plurality of second opening portions may have a closed loop shape surrounding the opening.

At least one of the plurality of second opening portions may be arranged between two neighboring partition walls from among the plurality of partition walls.

At least one of the plurality of second opening portions may be arranged between the opening and a partition wall that is closest to the opening from among the plurality of partition walls.

At least one of the plurality of second opening portions may be arranged between the display area and a partition wall that is closest to the display area from among the plurality of partition walls.

The organic layer may include at least one of a hole transport layer, a hole injection layer, an electron transport layer, and an electron injection layer.

The edge portion of the second electrode may be covered by the organic encapsulation layer.

An edge of the organic encapsulation layer may be arranged between the edge portion of the second electrode and the opening.

The display panel may further include a plurality of inorganic insulating layers on the substrate. The plurality of inorganic insulating layers may include a plurality of grooves each having a depth less than a sum of thicknesses of the plurality of inorganic insulating layers. The plurality of grooves may overlap a cover layer including an organic insulating material.

The display panel may further include an auxiliary layer between the display area and one of the plurality of partition walls, the auxiliary layer including a same material as the first electrode.

The display panel may further include a planarization layer on the encapsulation layer, overlapping the plurality of partition walls and a portion of the organic encapsulation layer, and including an organic insulating material.

The component may include a sensor or a camera.

According to one or more embodiments, a method of manufacturing a display panel includes forming a pixel circuit including a transistor in a display area, forming a partition wall in an intermediate area surrounded by the display area, forming a first electrode arranged in the display area, the first electrode being electrically connected to the transistor, forming a plurality of auxiliary layers in the intermediate area, forming an emission layer on the first electrode, forming an organic layer on the first electrode and the plurality of auxiliary layers, forming a second electrode on the first electrode and the plurality of auxiliary layers, irradiating a stacked structure of the plurality of auxiliary layers, the organic layer, and the second electrode with a laser such that the second electrode includes a single first opening portion in the intermediate area, and the organic layer includes a plurality of second opening portions arranged in the intermediate area, forming an encapsulation layer on the second electrode, the encapsulation layer including an organic encapsulation layer and an inorganic encapsulation layer, and forming an opening by removing a stacked structure in an opening area inside the intermediate area. The organic layer includes a plurality of organic portions separated from each other by the plurality of second opening portions, the plurality of organic portions being arranged in the first opening portion.

Top surfaces of the plurality of organic portions may contact the inorganic encapsulation layer.

Each of the plurality of second opening portions may have a closed loop shape in a plan view.

The partition wall includes a plurality of partition walls. At least one of the plurality of second opening portions may be arranged between two neighboring partition walls from among the plurality of partition walls.

The partition wall includes a plurality of partition walls. At least one of the plurality of second opening portions may be arranged between the opening and a partition wall closest to the opening from among the plurality of partition walls.

The partition wall includes a plurality of partition walls. At least one of the plurality of second opening portions may be between the display area and a partition wall closest to the display area from among the plurality of partition walls.

The plurality of auxiliary layers may include a same material as the first electrode.

The organic layer may include at least one of a hole transport layer, a hole injection layer, an electron transport layer, and an electron injection layer.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
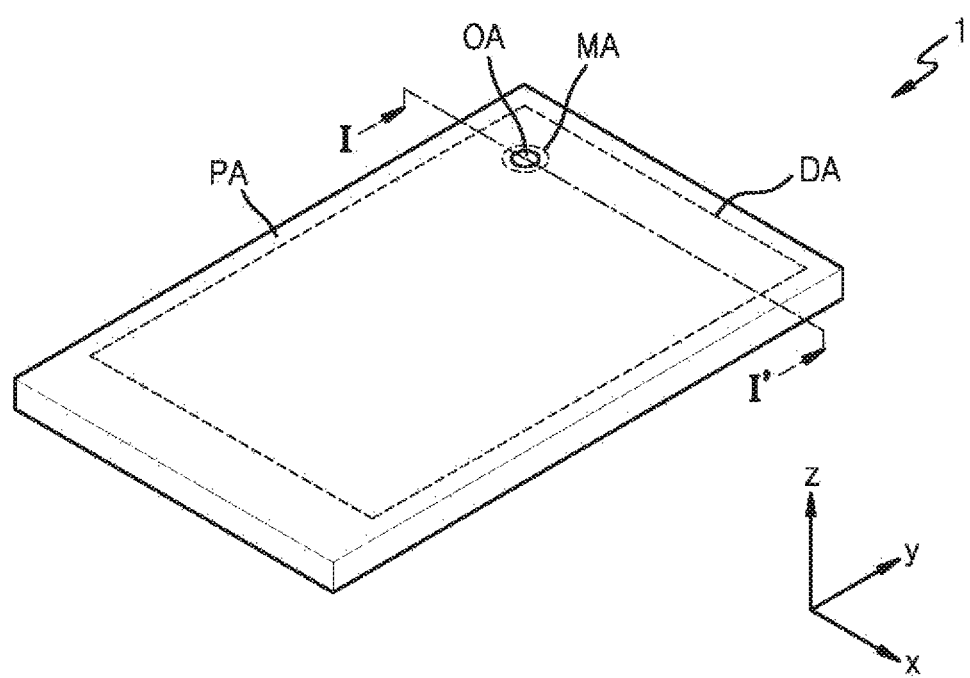
FIG. 1 is a perspective view of an electronic apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

As the present disclosure allows for various changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various forms.

Hereinafter, embodiments will be described with reference to the accompanying drawings, wherein like reference numerals refer to like elements throughout and a redundant description thereof may not be repeated.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to the other layer, region, or component with other layer, region, or component interposed therebetween.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

In the present specification, "A and/or B" means A or B, or A and B. In the present specification, "at least one of A and B" refers to A or B, or A and B.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an electronic apparatus 1 according to an embodiment.

Referring to FIG. 1, the electronic apparatus 1 may include an apparatus for displaying moving images or still images and may be used as a display screen of various suitable products including televisions, notebook computers, monitors, advertisement boards, Internet of things (IOT) as well as portable electronic apparatuses including mobile phones, smart phones, tablet personal computers (PC), mobile communication terminals, electronic organizers, electronic books, portable multimedia players (PMP), navigations, and ultra mobile personal computers (UMPC). In addition, the electronic apparatus 1 may be used in wearable devices including smartwatches, watchphones, glasses-type displays, and head-mounted displays (HMD). In addition, the electronic apparatus 1 may be used as instrument panels for automobiles, center fascias for automobiles, or center information displays (CID) arranged on a dashboard, room mirror displays that replace side mirrors of automobiles, and displays arranged on the backside of front seats as an entertainment for back seats of automobiles. For convenience of description, FIG. 1 shows the electronic apparatus 1 according to an embodiment is used as a smartphone for example.

The electronic apparatus 1 may have a rectangular shape in a plan view. For example, the electronic apparatus 1 may have a planar shape of a rectangle having short sides extending in an x-direction and long sides extending in a y-direction as shown in FIG. 1. A corner where a short side extending in the x-direction meets a long side extending in the y-direction may be round to have a curvature (e.g., a preset curvature) or may be formed at a right angle. The planar shape of the electronic apparatus 1 is not limited to a rectangle but be formed in other polygons, an elliptical shape, or an irregular shape.

The electronic apparatus 1 may include an opening area OA (or a first region) and a display area DA (or a second region) at least partially surrounding the opening area OA. The electronic apparatus 1 may include an intermediate area MA and a peripheral area PA (or a fourth region). The intermediate area MA may be a third region arranged between the opening area OA and the display area DA, and the peripheral area PA may be outside the display area DA. For example, the peripheral area PA may surround the display area DA.

The opening area OA may be arranged inside the display area DA. In an embodiment, the opening area OA may be arranged on or at the top left side of the display area DA as shown in FIG. 1. However, the present disclosure is not limited thereto and various suitable modifications may be made. For example, the opening area OA may be arranged on or at the center of the display area DA and/or arranged on or at the top right side of the display area DA. In a plan view of the present specification, "left", "right", "up", and "down" respectively denote directions when the electronic apparatus 1 is viewed from a direction perpendicular to a surface of the electronic apparatus 1. For example, "left" denotes a (−) x-direction, "right" denotes a (+) x-direction, "up" denotes a (+) y-direction, and "down" denotes a (−) y-direction. Though it is shown in FIG. 1 that one opening area OA is provided, a plurality of opening areas OA may be provided in another embodiment.

Figure 2:
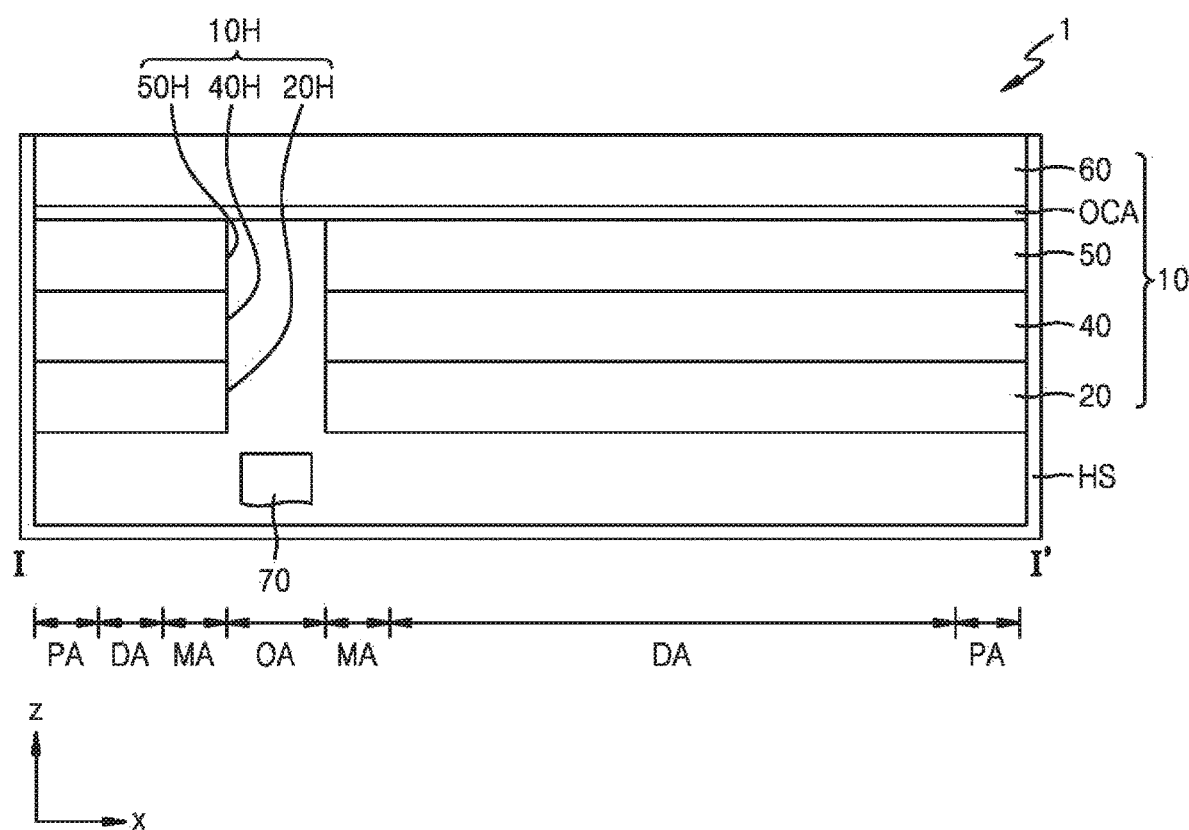
FIG. 2 is a cross-sectional view of an electronic apparatus according to an embodiment, taken along the line I-I' of FIG. 1.

FIG. 2 is a cross-sectional view of an electronic apparatus 1 according to an embodiment, taken along the line I-I' of FIG. 1.

Referring to FIG. 2, the electronic apparatus 1 may include the display panel 10 and a component 70 arranged in the opening area OA of the display panel 10. The display panel 10 and the component 70 may be received in a housing HS.

The display panel 10 may include a display element layer 20, an input-sensing layer 40, an optical functional layer 50, and a cover window 60.

The display element layer 20 may include display elements (or light-emitting elements) emitting light to display an image. The display element may include a light-emitting diode, for example, an organic light-emitting diode including an organic emission layer. In another embodiment, the light-emitting diode may be an inorganic light-emitting diode including an inorganic material. The inorganic light-emitting diode may include a PN diode including inorganic semiconductor-based materials. When a voltage is applied to a PN-junction diode in a forward direction, a hole and an electron are injected, and light having a color (e.g., a preset color) may be emitted by converting energy created due to recombination of the hole and the electron to light energy. The inorganic light-emitting diode may have a width ranging from several micrometers to several hundred micrometers or have a width ranging from several micrometers to several hundred nanometers. In an embodiment, the inorganic light-emitting diode may be denoted by a micro light-emitting diode (LED) or nano LED. In an embodiment, the display element layer 20 may include a quantum-dot light-emitting diode. For example, the emission layer of the display element layer 20 may include an organic material, an inorganic material, quantum dots, an organic material and quantum dots, or an inorganic material and quantum dots.

The input-sensing layer 40 may obtain an external input, for example, coordinate information corresponding to a touch event. The input-sensing layer 40 may include a sensing electrode (or a touch electrode) and trace lines connected to the sensing electrode. The input-sensing layer 40 may be arranged on the display element layer 20. The input-sensing layer 40 may sense an external input through a mutual capacitive method and/or a self-capacitive method.

The input-sensing layer 40 may be formed (e.g., directly formed) on the display element layer 20, or separately formed and then coupled to the display element layer 20 through an adhesive layer such as an optically transparent adhesive. For example, the input-sensing layer 40 may be continuously formed after a process of forming the display element layer 20. In this case, an adhesive layer may not be arranged between the input-sensing layer 40 and the display element layer 20. Though it is shown in FIG. 2 that the input-sensing layer 40 is arranged between the display element layer 20 and the optical functional layer 50, the input-sensing layer 40 may be arranged on the optical functional layer 50 in another embodiment.

The optical functional layer 50 may include an anti-reflection layer. The anti-reflection layer may reduce reflectivity of light (e.g., external light) incident on the anti-reflection layer of the display panel 10 from the outside through the cover window 60.

The anti-reflection layer may include a retarder and a polarizer. The retarder may include a film-type retarder or a liquid crystal-type retarder. The polarizer may include a film-type polarizer or a liquid crystal-type polarizer. The film-type polarizer may include a stretchable synthetic resin film, and the liquid crystal-type polarizer may include liquid crystals arranged in a suitable arrangement (e.g., a predetermined arrangement).

In another embodiment, the anti-reflection layer may include a black matrix and color filters. The color filters may be arranged by taking into account colors of pieces of light emitted respectively from light-emitting diodes of the display element layer 20. In another embodiment, the anti-reflection layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference (e.g., the first-reflected light and the second-reflected light may destructively interfere with each other) and thus the reflectivity of light (e.g., external light) may be reduced.

The optical functional layer 50 may include a lens layer. The lens layer may improve emission efficiency of light emitted from the display element layer 20 or reduce color deviation. The lens layer may include a layer having a concave or convex lens shape and/or include a plurality of layers having different refractive indices from each other. The optical functional layer 50 may include both the reflection prevention layer and the lens layer, or include one of these layers.

The display panel 10 may include an opening 10H. With regard to this, it is shown in FIG. 2 that the display element layer 20, the input-sensing layer 40, and the optical functional layer 50 respectively include first to third openings (i.e., a first opening 20H, a second opening 40H, and a third opening 50H), and the first to third openings 20H, 40H, and 50H overlap one another.

The first opening 20H may pass through from the top surface of the display element layer 20 to the bottom surface thereof. The second opening 40H may pass through from the top surface of the input-sensing layer 40 to the bottom surface thereof. The third opening 50H may pass through from the top surface of the optical function layer 50 to the bottom surface thereof.

The opening 10H of the display panel 10, for example, the first to third openings 20H, 40H, and 50H may be arranged to overlap one another in the opening area OA. The first to third openings 20H, 40H, and 50H may be the same or different from one other in size (e.g., in diameter).

In another embodiment, at least one of the display element layer 20, the input-sensing layer 40, and the optical functional layer 50 may not include an opening. For example, one or two layers from among the display element layer 20, the input-sensing layer 40, and the optical functional layer 50 may not include an opening.

The cover window 60 may be arranged on the optical functional layer 50. The cover window 60 may be coupled to the optical functional layer 50 through an adhesive layer such as an optically clear adhesive (OCA) arranged therebetween. The cover window 60 may include glass or plastic. The plastic may include polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 60 may include a window having flexibility. For example, the cover window 60 may include a polyimide window or an ultra-thin glass window.

The opening area OA may be a kind of component area (e.g., a sensor area, a camera area, a speaker area, etc.) in which the component 70 for adding various suitable functions to the electronic apparatus 1 is arranged. The component 70 may overlap the opening 10H of the display panel 10.

The component 70 may include an electronic element. For example, the component 70 may be an electronic element that uses light or sound. For example, the electronic element may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound. An electronic element that uses light may use light in various suitable wavelength bands such as visible light, infrared light, and ultraviolet light. The opening area OA corresponds to a transmission area through which light and/or sound output from the component 70 to the outside or progressing toward the component 70 from the outside may pass.

In another embodiment, in the case where the electronic apparatus 1 is used as a smartwatch or an instrument panel for an automobile, the component 70 may be a member such as clock hands or a needle indicating set information (e.g., predetermined information), such as the velocity of a vehicle, etc. In this case, unlike FIG. 1, the cover window 60 may include an opening arranged in the opening area OA such that the component 70 such as clock hands or a needle is exposed to or visible from the outside. In an embodiment, even in the case where the electronic apparatus 1 includes the component 70 such as a speaker, the cover window 60 may include an opening corresponding to the opening area OA.

Figure 3:
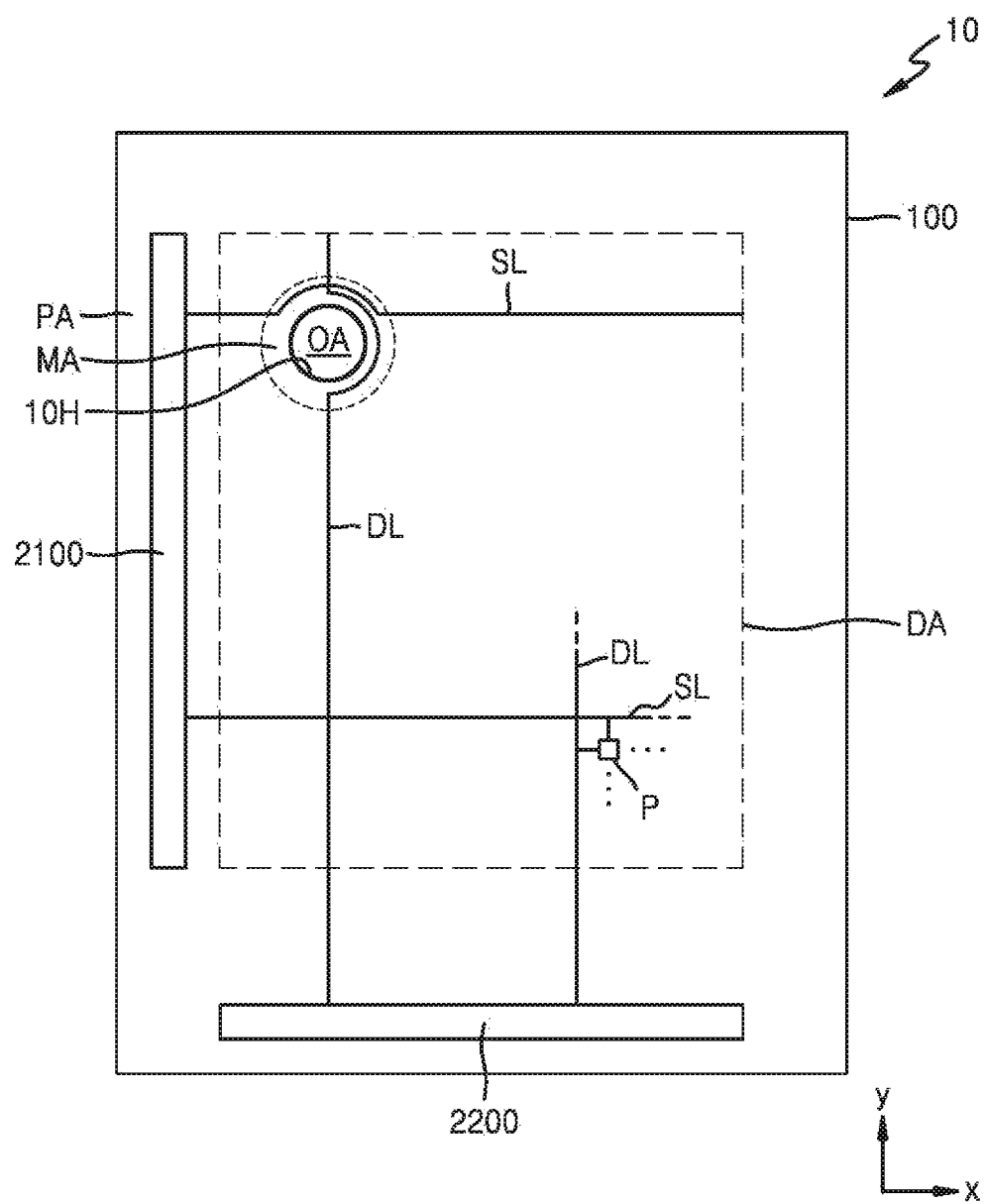
FIG. 3 is a plan view of a display panel according to an embodiment.
Figure 4:
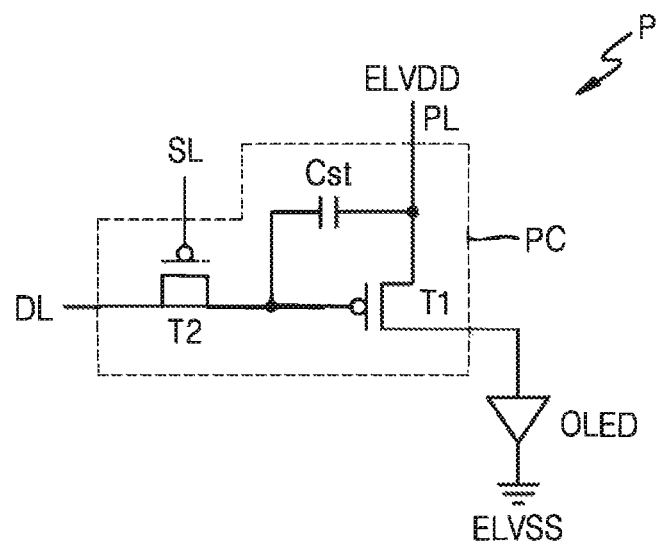
FIG. 4 is an equivalent circuit connected to one of light-emitting diodes of a display panel.

FIG. 3 is a plan view of the display panel 10 according to an embodiment, and FIG. 4 is an equivalent circuit connected to one of light-emitting diodes of the display panel 10.

Referring to FIG. 3, the display panel 10 may include the opening area OA, the display area DA, the intermediate area MA, and the peripheral area PA. The display panel 10 may include a plurality of pixels P arranged in the display area DA and display an image by using light, for example, red light, green light, or blue light emitted from a light-emitting diode of each pixel P.

A light-emitting diode of each pixel P may include an organic light-emitting diode OLED as shown in FIG. 4, and each organic light-emitting diode OLED may be connected (e.g., electrically connected) to a pixel circuit PC. Though it is shown in FIG. 4 that a light-emitting diode includes an organic light-emitting diode OLED, the display panel 10 may include an inorganic light-emitting diode instead of an organic light-emitting diode OLED as described above in another embodiment.

The pixel circuit PC may include a first thin-film transistor T1, a second thin-film transistor T2, and a storage capacitor Cst.

The second thin-film transistor T2 is a switching thin-film transistor and may be connected to a scan line SL and a data line DL. The second thin-film transistor T2 may transfer a data voltage to the first thin-film transistor T1 according to a switching voltage input through the scan line SL, the data voltage being input through the data line DL. The storage capacitor Cst is connected to the second thin-film transistor T2 and a driving voltage line PL. The storage capacitor Cst may store a voltage corresponding to a difference between a voltage transferred from the second thin-film transistor T2 and a first power voltage ELVDD supplied to the driving voltage line PL.

The first thin-film transistor T1 is a driving thin-film transistor and may be connected to the driving voltage line PL and the storage capacitor Cst and may control a driving current flowing from the driving voltage line PL to an organic light-emitting diode OLED according to the voltage stored in the storage capacitor Cst. The organic light-emitting diode OLED may emit light having a brightness (e.g., a preset brightness) according to the driving current. A second electrode (e.g., a cathode) of the organic light-emitting diode OLED may receive a second power voltage ELVSS.

Though FIG. 4 describes the case where the pixel circuit PC includes two thin-film transistors and one storage capacitor, the present disclosure is not limited thereto. The number of thin-film transistors and the number of storage capacitors may be variously changed in a suitable manner depending on the design of the pixel circuit PC.

Referring to FIG. 3 again, the intermediate area MA may surround the opening area OA. The intermediate area MA is a region in which a display element such as an organic light-emitting diode that emits light is not arranged. Signal lines providing a signal to pixels P arranged around the opening area OA may pass across the intermediate area MA. For example, data lines DL and/or scan lines SL may extend across the display area DA in a y-direction and/or an x-direction as shown in FIG. 3. Some of the data lines DL and/or the scan lines SL may detour the opening OA in the intermediate area MA along the edge of the opening 10H of the display panel 10 formed in the opening area OA. For example, the data lines DL and/or the scan lines SL may not overlap the opening area OA in a plan view or in a thickness direction of the display panel 10.

A scan driver 2100, a data driver 2200, a first main power line, and a second main power line may be arranged in the peripheral area PA, the scan driver 2100 providing a scan signal to each pixel P, the data driver 2200 providing a data signal to each pixel P, the first main power line providing the first power voltage ELVDD (e.g., see FIG. 4), and the second main power line providing the second power voltage ELVSS (e.g., see FIG. 4). Though it is shown in FIG. 3 that the data driver 2200 is arranged close to one side of the substrate 100, the data driver 2200 may be arranged on a printed circuit board connected (e.g., electrically connected) to a pad arranged on or at one side of display panel 10 in another embodiment. The printed circuit board may be flexible and a portion of the printed circuit board may be bent to be arranged below the bottom surface of the substrate 100.

Figure 5:
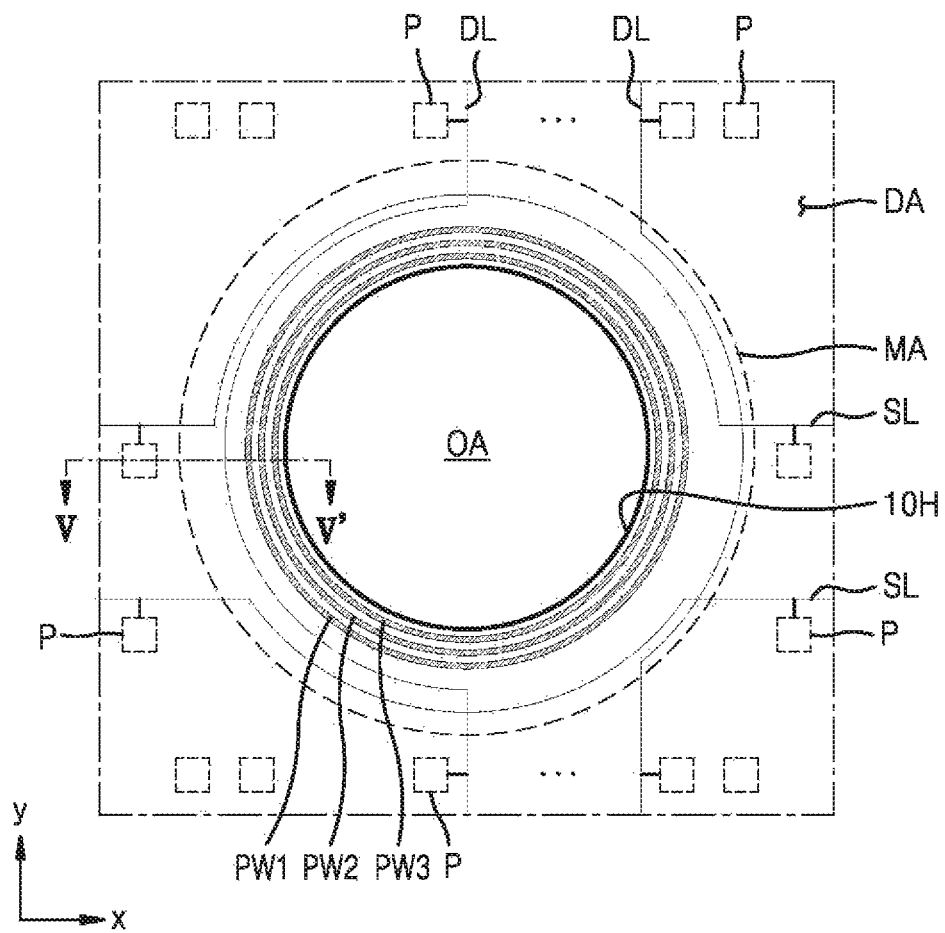
FIG. 5 is a plan view of a portion of a display panel according to an embodiment.

FIG. 5 is a plan view of a portion of the display panel 10 according to an embodiment.

Referring to FIG. 5, pixels P are arranged in the display area DA. The intermediate area MA may be arranged between the opening area OA and the display area DA. Pixels P neighboring the opening area OA may be spaced from (e.g., spaced apart from) each other around the opening area OA in a plan view. As shown in a plan view of FIG. 5, pixels P may be vertically spaced from (e.g., vertically spaced apart from) each other around the opening area OA, or horizontally spaced from (e.g., horizontally spaced apart from) each other around the opening area OA. As described with reference to FIGS. 3 and 4, each pixel P uses light having a red color, a green color, or a blue color emitted from a light-emitting diode, and thus, the positions of the pixels P shown in FIG. 4 correspond to the positions of light-emitting diodes, respectively. Accordingly, when the pixels P are spaced from (e.g., spaced apart from) each other around the opening area OA in a plan view, it may denote that corresponding light-emitting diodes are spaced from (e.g., spaced apart from) each other around the opening area OA in a plan view. For example, in a plan view, light-emitting diodes may be vertically spaced from (e.g., vertically spaced apart from) each other around the opening area OA, or horizontally spaced from (e.g., horizontally spaced apart from) each other around the opening area OA.

Signal lines that neighbor the opening area OA from among signal lines supplying a signal to the pixel circuits connected to the light-emitting diodes of the pixels P, may detour the opening area OA and/or the opening 10H. For example, signal lines that neighbor the opening area OA may not overlap the opening area OA and/or the opening 10H in a plan view or in a thickness direction of the display panel 10.

Some of the data lines DL passing across the display area DA may extend in a ±y direction to provide a data signal to the pixels P vertically arranged with the opening area OA therebetween, and detour along the opening area OA and/or the edge of the opening 10H in the intermediate area MA. Some of the scan lines SL passing across the display area DA may extend in a ±x direction to provide a scan signal to the pixels P horizontally arranged with the opening area OA therebetween, and detour along the opening area OA and/or the edge of the opening 10H in the intermediate area MA.

Though it is shown in FIG. 5 that the scan line SL detours the opening area OA and/or the opening 10H in the intermediate area MA, the present disclosure is not limited thereto. In another embodiment, the scan line SL may be separated and/or disconnected around the opening area OA and/or the opening 10H. The scan line SL on the left of the opening area OA and/or the opening 10H may receive a signal from the scan driver 2100 on the left of the display area DA as shown in FIG. 3, and the scan line SL on the right of the opening area OA and/or the opening 10H may receive a signal from an additional scan driver arranged opposite to the scan driver 2100 around the display area DA.

At least one partition wall may be arranged in the intermediate area MA. The at least one partition wall may be arranged closer to the opening area OA than a detouring portion of the signal line. With regard to this, FIG. 5 shows first to third partition walls (i.e., a first partition wall PW1, a second partition wall PW2, and a third partition wall PW3). The first to third partition walls PW1, PW2, and PW3 may be spaced from (e.g., spaced apart from) each other in a closed loop shape surrounding the opening area OA and/or the opening 10H.

Figure 6A:
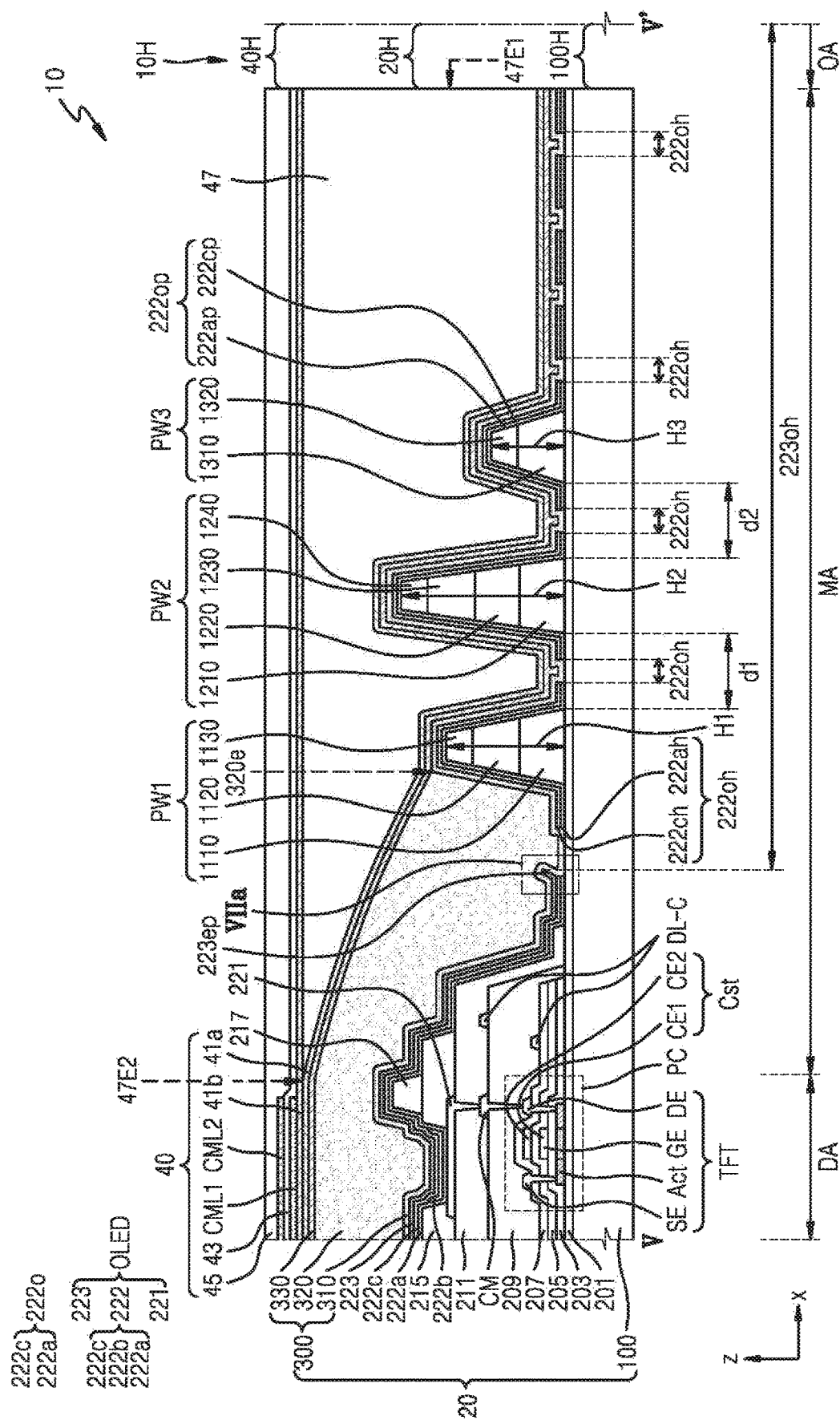
FIGS. 6A and 6B are cross-sectional views of a display panel according to an embodiment, taken along the line V-V of FIG. 5.
Figure 6B:
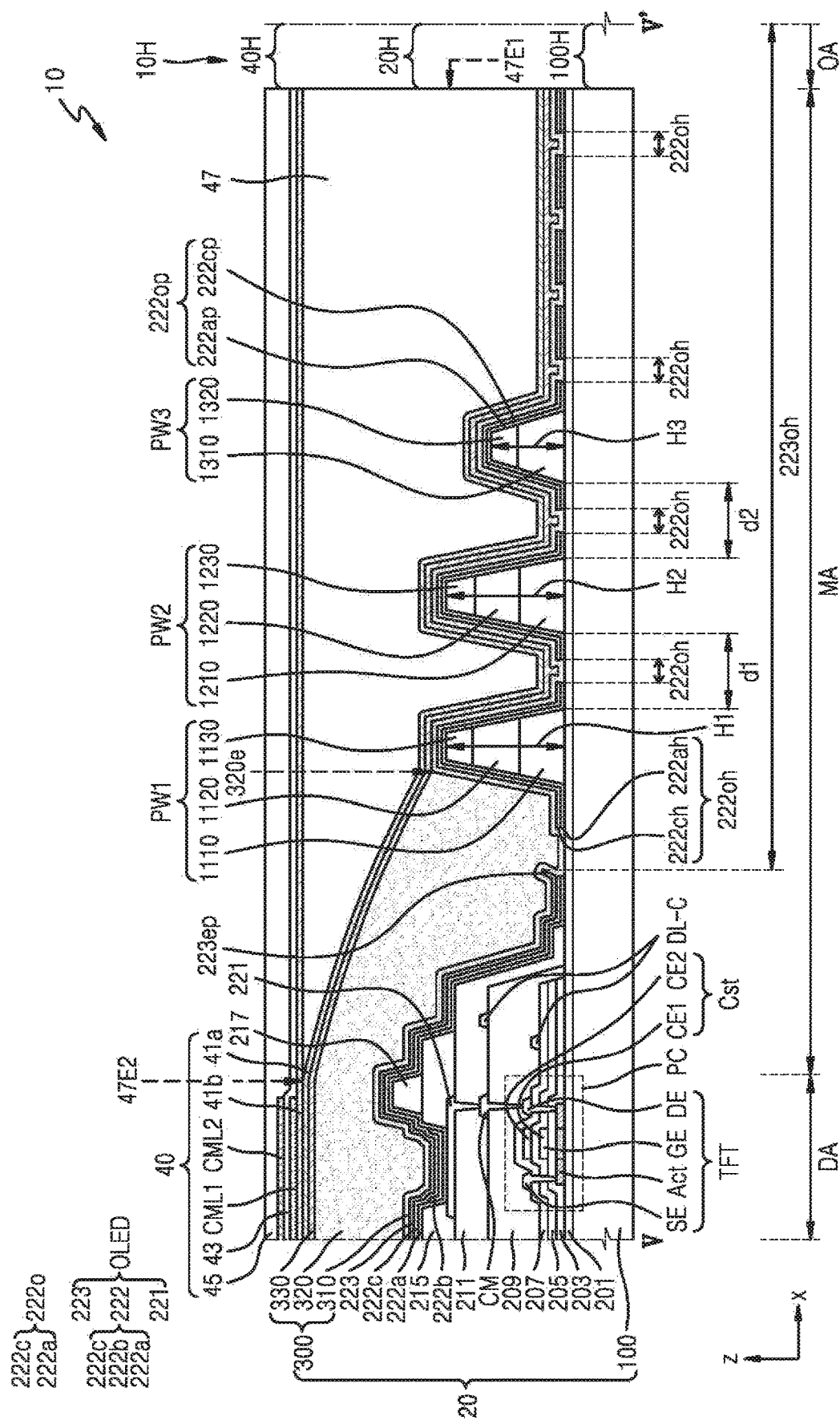
Figure 7A:
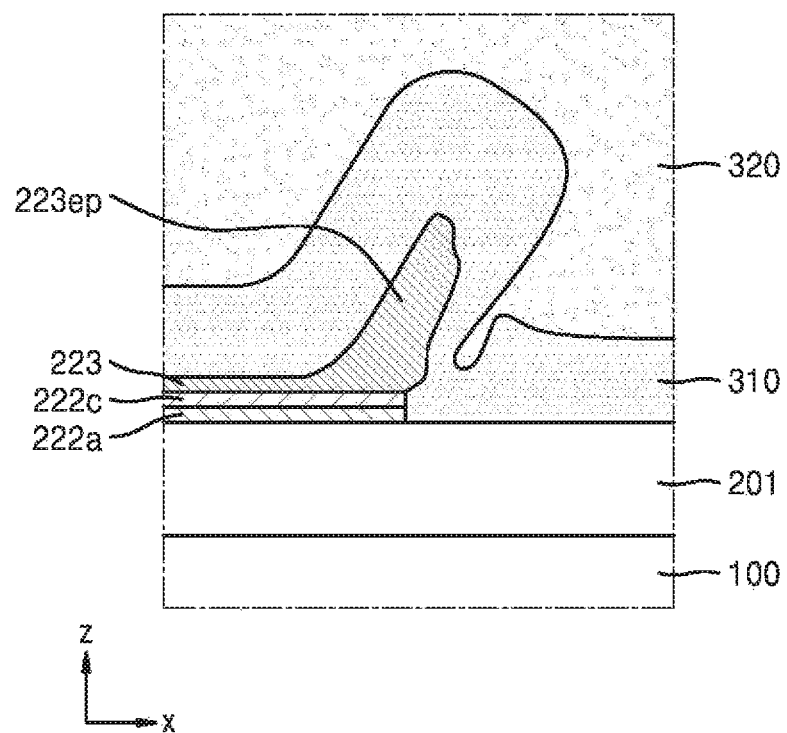
FIG. 7A is an enlarged cross-sectional view of region VIIa of FIG. 6A.
Figure 7B:
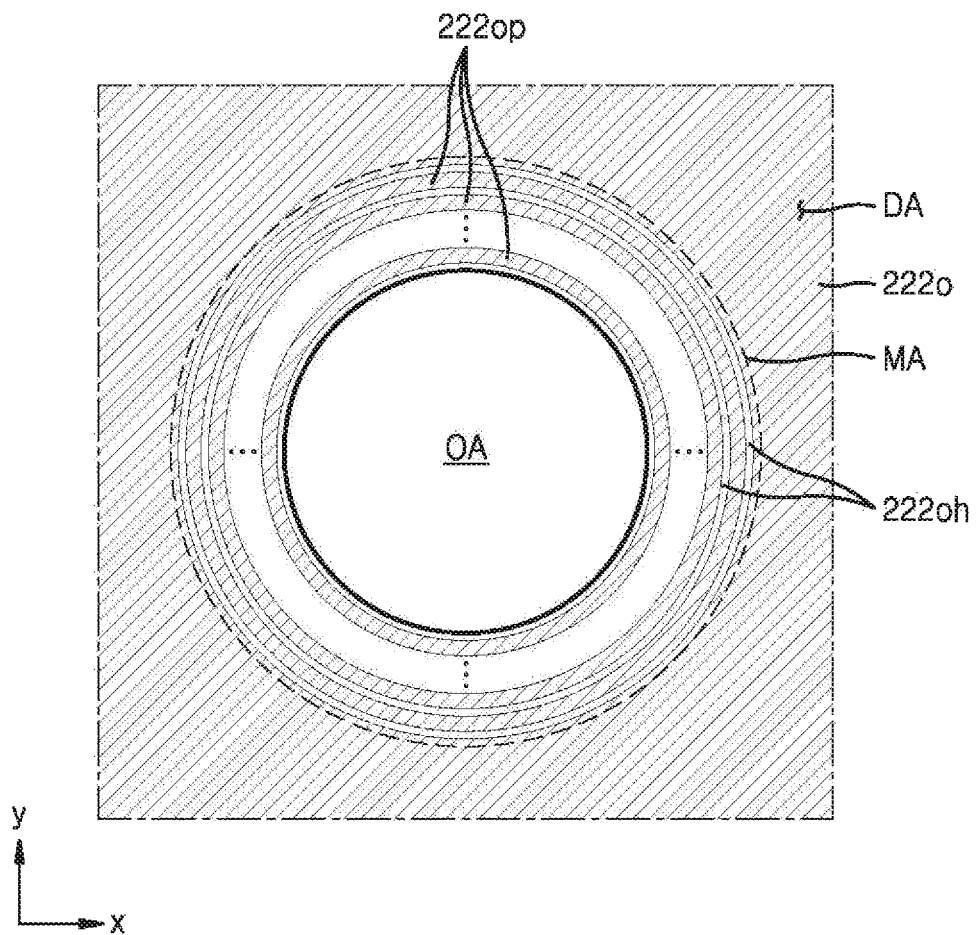
FIG. 7B is a plan view of a functional layer shown in FIG. 6A.
Figure 7C:
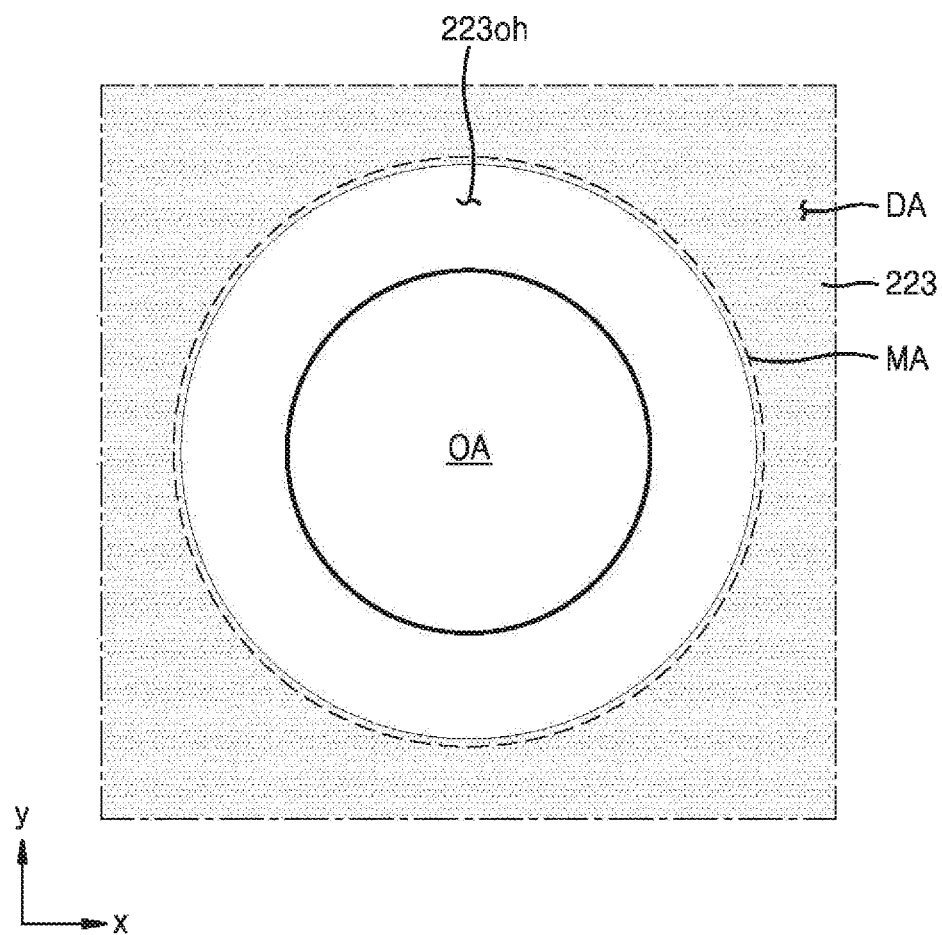
FIG. 7C is a plan view of a second electrode shown in FIG. 6A.

FIGS. 6A and 6B are cross-sectional views of the display panel 10 according to an embodiment, taken along the line V-V' of FIG. 5, FIG. 7A is an enlarged cross-sectional view of a region VIIa of FIG. 6A, FIG. 7B is a plan view of a functional layer shown in FIG. 6A, and FIG. 7C is a plan view of a second electrode shown in FIG. 6A. For convenience of description, FIG. 6A omits the optical functional layer 50 (e.g., see FIG. 2) and the cover window 60 (e.g., see FIG. 2) of the display panel 10 and shows the display element layer 20 and the input-sensing layer 40 on the display element layer 20. The display element layer 20 includes light-emitting diodes arranged over the substrate 100 to correspond to the display area DA. With regard to this, FIGS. 6A and 6B show one light-emitting diode, for example, an organic light-emitting diode OLED.

The display panel 10 may include an opening 10H in the opening area OA. The opening 10H may have a shape of a through hole (e.g., a hole penetrating through an object) passing through the top surface and bottom surface of the display panel 10.

When the display panel 10 includes the opening 10H arranged in the opening area OA, it may denote that a plurality of layers of the display panel 10 include an opening arranged in the opening area OA. The substrate 100 may include an opening 100H arranged in the opening area OA. The opening 100H of the substrate 100 has a shape of a through hole passing through the top surface and bottom surface of the substrate 100. Likewise, the display element layer 20 and the input-sensing layer 40 each including layers over the substrate 100 may respectively include the first opening 20H and the second opening 40H having a shape of a through hole arranged in the opening area OA. For example, the first opening 20H may pass through the display element layer 20 and the second opening 40H may pass through the input-sensing layer 40. In an embodiment, the first opening 20H, the second opening 40H, and the opening 100H may overlap each other in the opening area OA to constitute a single opening.

Referring to the display area DA of FIGS. 6A and 6B, the pixel circuit PC may be arranged over the substrate 100, and the organic light-emitting diode OLED may be arranged over the pixel circuit PC.

The substrate 100 may include glass or a polymer resin. For example, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including a polymer resin may be flexible, rollable, or bendable. The substrate 100 may have a multi-layer structure including an organic layer including the polymer resin and an inorganic layer.

A buffer layer 201 may be arranged on the top surface of the substrate 100. The buffer layer 201 may prevent (or substantially prevent) impurities from penetrating into a semiconductor layer Act of a thin-film transistor TFT. The buffer layer 201 may include an inorganic insulating material such as silicon nitride, silicon oxynitride, and silicon oxide and include a single layer or a multi-layer structure including the inorganic insulating materials.

The pixel circuit PC may be arranged on the buffer layer 201. The pixel circuit PC includes a thin-film transistor TFT and a storage capacitor Cst. The thin-film transistor TFT may include the semiconductor layer Act, a gate electrode GE, a source electrode SE, and a drain electrode DE. Though FIGS. 6A and 6B show the top-gate type thin-film transistor TFT in which the gate electrode GE is arranged over the semiconductor layer Act with a gate insulating layer 203, the thin-film transistor TFT may be a bottom-gate type thin-film transistor TFT.

The semiconductor layer Act may include polycrystalline silicon. Alternatively, the semiconductor layer Act may include amorphous silicon, an oxide semiconductor, or an organic semiconductor. The gate electrode GE may include a low-resistance metal material. The gate electrode GE may include a conductive material including molybdenum (Mo), aluminum (Al), copper (Cu), and/or titanium (Ti) and include a single layer or a multi-layer structure including the above materials.

A gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and/or hafnium oxide. The gate insulating layer 203 may include a single layer or a multi-layer structure including the above materials.

The source electrode SE and the drain electrode DE may include a material having excellent conductivity. The source electrode SE and the drain electrode DE may include a conductive material including molybdenum (Mo), aluminum (Al), copper (Cu), and/or titanium (Ti) and include a single layer or a multi-layer structure including the above materials. In an embodiment, the source electrode SE and the drain electrode DE may have a multi-layer structure of a titanium layer, an aluminum layer, and a titanium layer (Ti/Al/Ti).

The storage capacitor Cst may include a bottom electrode CE1 and a top electrode CE2 overlapping each other with a first interlayer insulating layer 205 therebetween. The storage capacitor Cst may overlap the thin-film transistor TFT. With regard to this, it is shown in FIGS. 6A and 6B that the gate electrode GE of the thin-film transistor TFT serves as the bottom electrode CE1 of the storage capacitor Cst. In another embodiment, the storage capacitor Cst may not overlap the thin-film transistor TFT, and the gate electrode GE of the thin-film transistor TFT may be formed separately from the bottom electrode CE1 of the storage capacitor Cst. The storage capacitor Cst may be covered by a second interlayer insulating layer 207.

The bottom electrode CE1 and/or the top electrode CE2 of the storage capacitor Cst may include a conductive material including molybdenum (Mo), aluminum (Al), copper (Cu), and/or titanium (Ti) and include a single layer or a multi-layer structure including the above materials.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, and/or hafnium oxide. The first interlayer insulating layer 205 and the second interlayer insulating layer 207 may each include a single layer or a multi-layer structure including the above materials. Alternatively, the first interlayer insulating layer 205 and the second interlayer insulating layer 207 may each include an organic insulating material. The organic insulating material may include a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The pixel circuit PC may be covered by a first intermediate insulating layer 209 (or a first via insulating layer) between the pixel circuit PC and a first electrode 221 described below, the pixel circuit PC including the thin-film transistor TFT and the storage capacitor Cst. The first intermediate insulating layer 209 may include an approximately flat top surface.

The first electrode 221 is arranged on the pixel circuit PC. The first electrode 221 may be arranged for each pixel and connected (e.g., electrically connected) to the pixel circuit PC. For example, as shown in FIGS. 6A and 6B, a contact metal layer CM may be arranged between the thin-film transistor TFT and the first electrode 221. The contact metal layer CM may contact the thin-film transistor TFT through a contact hole formed in the first intermediate insulating layer 209. The first electrode 221 may contact the contact metal layer CM through a contact hole formed in a second intermediate insulating layer 211 on the contact metal layer CM. The contact metal layer CM may include a conductive material including molybdenum (Mo), aluminum (Al), copper (Cu), and/or titanium (Ti) and include a single layer or a multi-layer structure including the above materials. As an embodiment, the contact metal layer CM may include a multi-layer structure of Ti/Al/Ti.

The first intermediate insulating layer 209 and the second intermediate insulating layer 211 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. For example, the first intermediate insulating layer 209 and the second intermediate insulating layer 211 may include polyimide.

Though it is shown in FIGS. 6A and 6B that the contact metal layer CM is arranged between the first intermediate insulating layer 209 and the second intermediate insulating layer 211 and connects (e.g., electrically connects) the pixel circuit PC to the first electrode 221, the contact metal layer CM may be omitted in another embodiment. In this case, the thin-film transistor TFT of the pixel circuit PC may be directly connected to the first electrode 221, and one of the first intermediate insulating layer 209 and the second intermediate insulating layer 211 may be omitted.

For example, one interlayer insulating layer may be arranged between the pixel circuit PC and the first electrode 221, and the first electrode 221 may be connected to the thin-film transistor TFT of the pixel circuit PC through one interlayer insulating layer.

The first electrode 221 may be formed on the second intermediate insulating layer 211. The first electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first electrode 221 may further include a layer including ITO, IZO, ZnO, or $In_2O_3$ on or under the reflective layer. In an embodiment, the first electrode 221 may have a three-layered structure of ITO/Ag/ITO.

An upper insulating layer 215 may be formed on the first electrode 221. The upper insulating layer 215 may include an opening that exposes the top surface of the first electrode 221 and cover the edges of the first electrodes 221. The upper insulating layer 215 may be a pixel-defining layer defining a pixel. For example, the width of the opening that exposes the top surface of the first electrode 221 may correspond to the width of an emission area through which light is emitted, or may correspond to the width of a pixel.

The upper insulating layer 215 may include an organic insulating material. For example, the upper insulating layer 215 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A spacer 217 may be formed on the upper insulating layer 215. The spacer 217 may include an organic insulating material. The spacer 217 may include the same material as the upper insulating layer 215 and be concurrently (e.g., simultaneously) formed during the same mask process.

An intermediate layer 222 may include an emission layer 222b. The emission layer 222b may include a polymer or a low-molecular weight organic material that emits light of a color (e.g., a preset color). The intermediate layer 222 may include a functional layer. The functional layer may include a first functional layer 222a and/or a second functional layer 222c. The first functional layer 222a may be under the emission layer 222b, and the second functional layer 222c may be on the emission layer 222b.

The first functional layer 222a may include a single layer or a multi-layer structure. For example, the first functional layer 222a may include a hole injection layer (HIL) and/or a hole transport layer (HTL).

The second functional layer 222c may include a single layer or a multi-layer structure. The second functional layer 222c may include an electron transport layer (ETL) and/or an electron injection layer (EIL).

At least one organic layer 222o of the intermediate layer 222, for example, the first functional layer 222a and/or the second functional layer 222c may cover the entire display area DA. Emission layers 222b of different colors may be spaced from (e.g., spaced apart from) each other according to the colors of the corresponding pixels in the display area DA, and the first functional layer 222a and/or the second functional layer 222c may cover the entire display area DA. The first functional layer 222a and the second functional layer 222c may be each shared by a plurality of pixels arranged in the display area DA. Accordingly, the first functional layer 222a and the second functional layer 222c may each cover a plurality of first electrodes 221.

A second electrode 223 may include a conductive material having a low work function. For example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the second electrode 223 may further include a layer including ITO, IZO, ZnO, or $In_2O_3$ on/under the (semi) transparent layer including the above material. In an embodiment, the second electrode 223 may include Ag and Mg. The second electrode 223 may cover the entire display area DA. The second electrode 223 may be a common layer and may cover the plurality of first electrodes 221. The second electrode 223 and the functional layers, which are common layers covering (e.g., entirely covering) the display area DA, may have different thicknesses from each other. The second electrode 223 may be thinner than the thickness of the organic layer of the intermediate layer 222, for example, the thickness of a stack body of the first and second functional layers 222a and 222c.

The organic light-emitting diode OLED including the first electrode 221, the intermediate layer 222, and the second electrode 223 is covered by an encapsulation layer 300. The encapsulation layer 300 may include at least one organic encapsulation layer and at least one inorganic encapsulation layer. It is shown in FIGS. 6A and 6B that the encapsulation layer 300 includes first and second inorganic encapsulation layers 310 and 330, and an organic encapsulation layer 320 therebetween. In another embodiment, the number of organic encapsulation layers, the number of inorganic encapsulation layers, and a stacking order may be suitably changed.

The first inorganic encapsulation layer 310 and the second inorganic encapsulation layer 330 may include a least one inorganic material such as aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or a multi-layer structure including the above materials. The organic encapsulation layer 320 may include a polymer-based material. The polymer-based material may include an acryl-based resin such as polymethylmethacrylate and poly acrylic acid, an epoxy-based resin, polyimide, and polyethylene. In an embodiment, the organic encapsulation layer 320 may include acrylate polymer.

The material of the first inorganic encapsulation layer 310 may be different from the material of the second inorganic encapsulation layer 330. For example, the first inorganic encapsulation layer 310 may include silicon oxynitride, and the second inorganic encapsulation layer 330 may include silicon nitride. The thickness of the first inorganic encapsulation layer 310 may be different from the thickness of the second inorganic encapsulation layer 330. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or be the same as or equal to the thickness of the first inorganic encapsulation layer 310.

The input-sensing layer 40 may be arranged on the encapsulation layer 300. The input-sensing layer 40 may include a first sub-insulating layer 41a and a second sub-insulating layer 41b, a first conductive layer CML1, a second insulating layer 43, a second conductive layer CML2, and a third insulating layer 45.

The first sub-insulating layer 41a and the second sub-insulating layer 41b may include an inorganic insulating layer, for example, an inorganic insulating layer such as silicon oxide, silicon nitride, and silicon oxynitride.

The first conductive layer CML1 and the second conductive layer CML2 may each include a conductive material, for example, metal. For example, the first conductive layer CML1 and the second conductive layer CML2 may each include molybdenum (Mo), aluminum (Al), copper (Cu), and/or titanium (Ti) and include a single layer or a multi-layer structure including the above materials. In an embodiment, the first conductive layer CML1 and the second conductive layer CML2 may each have a structure of Ti/Al/Ti in which a titanium layer, an aluminum layer, and a titanium layer are sequentially stacked.

The first conductive layer CML1 and/or the second conductive layer CML2 may each include a plurality of touch electrodes configured to sense a touch input. In an embodiment, the input-sensing layer 40 may include touch electrodes extending in the x-direction and touch electrodes extending in the y-direction in a plan view. The touch electrodes may sense an input through a mutual capacitive method and be provided to the first conductive layer CML1 and/or the second conductive layer CML2.

In another embodiment, the touch electrode may sense an input through a self-capacitive method and be provided to the first conductive layer CML1 or the second conductive layer CML2.

The second insulating layer 43 may be arranged between the first conductive layer CML1 and the second conductive layer CML2. The second insulating layer 43 may include an inorganic insulating layer such as silicon oxide, silicon nitride, and silicon oxynitride.

The third insulating layer 45 may include an organic insulating material. For example, the third insulating layer 45 may include a polymer-based material. The polymer-based material may be transparent. For example, the third insulating layer 45 may include a silicon-based resin, an acryl-based resin, an epoxy-based resin, polyimide, and polyethylene.

Though it is shown in FIGS. 6A and 6B that the input-sensing layer 40 includes the first conductive layer CML1 and the second conductive layer CML2, the input-sensing layer 40 may include one of the first conductive layer CML1 and the second conductive layer CML2 in another embodiment.

Next, referring to the intermediate area MA of FIGS. 6A and 6B, the first intermediate insulating layer 209 and the second intermediate insulating layer 211 may extend to the intermediate area MA. For example, the first intermediate insulating layer 209 and the second intermediate insulating layer 211 may extend to the intermediate area MA and be spaced from (e.g., spaced apart from) a first partition wall PW1 described below. Similarly, the gate insulating layer 203, the first interlayer insulating layer 205, and the second interlayer insulating layer 207 may each extend to the intermediate area MA and be spaced from (e.g., spaced apart from) the first partition wall PW1. In this case, the first intermediate insulating layer 209 may extend further toward the first partition wall PW1 than the gate insulating layer 203, the first interlayer insulating layer 205, and the second interlayer insulating layer 207.

The first intermediate insulating layer 209 may cover each of the gate insulating layer 203, the first interlayer insulating layer 205, and the second interlayer insulating layer 207. The second intermediate insulating layer 211 may extend further toward the first partition wall PW1 than the first intermediate insulating layer 209.

In the intermediate area MA, detouring portions DL-C of data lines may be arranged on the first intermediate insulating layer 209 and the second interlayer insulating layer 207. The detouring portion DL-C of the data line on the first intermediate insulating layer 209 and the detouring portion DL-C of the data line on the second interlayer insulating layer 207 shown in FIGS. 6A and 6B correspond to a portion (e.g., a curved portion along the opening area OA in FIG. 5) of the data line DL that is arranged in the intermediate area MA described above with reference to FIG. 5.

At least one partition wall is arranged in the intermediate area MA. In an embodiment, though it is shown in FIGS. 6A and 6B that three partition walls are provided, two or four or more partition walls may be provided in another embodiment. The first to third partition walls PW1, PW2, and PW3 may be arranged on (e.g., directly on) the buffer layer 201.

The first to third partition walls PW1, PW2, and PW3 may be arranged in the intermediate area MA and be spaced from (e.g., spaced apart from) each other in a direction from the display area DA to the opening area OA. The first partition wall PW1 may be closest to the display area DA, the third partition wall PW3 may be closest to the opening area OA, and the second partition wall PW2 may be arranged between the first partition wall PW1 and the third partition wall PW3. The first to third partition walls PW1, PW2, and PW3 may each have a closed-loop shape surrounding the opening 10H as shown in FIG. 5.

As shown in FIGS. 6A and 6B, and the embodiments described below, the opening 100H is formed also in the substrate 100 to correspond to the opening 10H of the display panel 10, and thus, the "opening area OA", the "opening 10H of the display panel 10", and the "opening 100H of the substrate 100" may be used interchangeably in the present specification. For example, "surrounding the opening 10H of the display panel 10" may denote surrounding the opening 100H of the substrate 100 and/or surrounding the opening area OA.

The first to third partition walls PW1, PW2, and PW3 may be spaced from (e.g., spaced apart from) one another. In an embodiment, a distance between neighboring (e.g., adjacent) partition walls may be the same. For example, a distance d1 (e.g., a distance in a horizontal direction) between the first partition wall PW1 and the second partition wall PW2 may be the same as or equal to a distance d2 (e.g., a distance in a horizontal direction) between the second partition wall PW2 and the third partition wall PW3.

The first to third partition walls PW1, PW2, and PW3 may each include an insulating material. For example, the first to third partition walls PW1, PW2, and PW3 may include an organic insulating material, may be concurrently (e.g., simultaneously) formed during a process of forming a plurality of insulating material layers arranged in the display area DA, and may include the same material as the plurality of insulating material layers.

As shown in FIGS. 6A and 6B, the first partition walls PW1 may include a plurality of first sub-partition wall layers (or a plurality of first sub-partition walls) 1110, 1120, and 1130. The plurality of first sub-partition wall layers 1110, 1120, and 1130 may include a (1-1)st sub-partition wall layer 1110, a (1-2)nd sub-partition wall layer 1120, and a (1-3)rd sub-partition wall layer 1130 that are stacked (e.g., sequentially stacked).

In an embodiment, the (1-1)st sub-partition wall layer 1110 may include the same material as the second intermediate insulating layer 211. The (1-2)nd sub-partition wall layer 1120 may include the same material as the upper insulating layer 215. The (1-3)rd sub-partition wall layer 1130 may include the same material as the spacer 217. The (1-3)rd sub-partition wall layer 1130 may include the same material as the (1-2)nd sub-partition wall layer 1120 and concurrently (e.g., simultaneously) formed during the same mask process.

As shown in FIG. 6A, the second partition wall PW2 may include a plurality of second sub-partition wall layers 1210, 1220, 1230, and 1240. The plurality of second sub-partition wall layers (or a plurality of second sub-partition walls) 1210, 1220, 1230, and 1240 may include a (2-1)st sub-partition wall layer 1210, a (2-2)nd sub-partition wall layer 1220, a (2-3)rd sub-partition wall layer 1230, and a (2-4)th sub-partition wall layer 1240 that are stacked (e.g., sequentially stacked).

In an embodiment, the (2-1)st sub-partition wall layer 1210 may include the same material as the first intermediate insulating layer 209, the (2-2)nd sub-partition wall layer 1220 may include the same material as the second intermediate insulating layer 211, the (2-3)rd sub-partition wall layer 1230 may include the same material as the upper insulating layer 215, and the (2-4)th sub-partition wall layer 1240 may include the same material as the spacer 217. The (2-4)th sub-partition wall layer 1240 and the (2-3)rd sub-partition wall layer 1230 may include the same material, and concurrently (e.g., simultaneously) formed during the same mask process.

In another embodiment, as shown in FIG. 6B, the second partition wall PW2 may include a (2-1)st sub-partition wall layer 1210, a (2-2)nd sub-partition wall layer 1220, and a (2-3)rd sub-partition wall layer 1230. The (2-1)st sub-partition wall layer 1210 may include the same material as the (1-1)st sub-partition wall layer 1110 of the first partition wall PW1 and be formed during the same mask process. The (2-2)nd sub-partition wall layer 1220 may include the same material as the (1-2)nd sub-partition wall layer 1120 of the first partition wall PW1 and be formed during the same mask process. The (2-3)rd sub-partition wall layer 1230 may include the same material as the (1-3)rd sub-partition wall layer 1130 of the first partition wall PW1 and be formed during the same mask process.

As shown in FIGS. 6A and 6B, the third partition wall PW3 may include a plurality of sub-partition wall layers 1310 and 1320. The plurality of sub-partition wall layers (or a plurality of sub-partition walls) 1310 and 1320 may include a (3-1)st sub-partition wall layer 1310 and a (3-2)nd sub-partition wall layer 1320 that are stacked (e.g., sequentially stacked).

In an embodiment, the (3-1)st sub-partition wall layer 1310 may include the same material as the upper insulating layer 215, and the (3-2)nd sub-partition wall layer 1320 may include the same material as the spacer 217. The (3-2)nd sub-partition wall layer 1320 may include the same material as the (3-1)st sub-partition wall layer 1310 and be concurrently (e.g., simultaneously) formed during the same mask process.

Respective sub-layers of the first to third partition walls PW1, PW2, and PW3 may be concurrently (e.g., simultaneously) formed during the same mask process of forming at least one of the first intermediate insulating layer 209, the second intermediate insulating layer 211, the upper insulating layer 215, and the spacer 217 and are not limited to the above embodiments and may have various suitable configurations.

The height of at least one of the first to third partition walls PW1, PW2, and PW3 may be different from the height of the rest of the first to third partition walls PW1, PW2, and PW3. For example, as shown in FIG. 6A, a height H2 of the second partition wall PW2 may be greater than heights H1 and H3 of the first and third partition walls PW1 and PW3. The height H1 of the first partition wall PW1 may be greater than the height H3 of the third partition wall PW3. In other words, a vertical distance from the top surface of the substrate 100 to the top surface of the second partition wall PW2 may be greater than a vertical distance from the top surface of the substrate 100 to the top surface of the first partition wall PW1. A vertical distance from the top surface of the substrate 100 to the top surface of the first partition wall PW1 may be greater than a vertical distance from the top surface of the substrate 100 to the top surface of the third partition wall PW3.

Though it is shown in FIG. 6A that the first partition wall PW1 and the second partition wall PW2 have different heights, the first partition wall PW1 and the second partition wall PW2 may have substantially the same height in another embodiment. In other words, a vertical distance from the top surface of the substrate 100 to the top surface of the first partition wall PW1 may be substantially the same as or equal to a vertical distance from the top surface of the substrate 100 to the top surface of the second partition wall PW2. A vertical distance from the top surface of the substrate 100 to the top surface of the second partition wall PW2 may be equal to or less than a vertical distance from the top surface of the substrate 100 to the top surface of the spacer 217.

The above-described one or more partition walls, for example, the first partition wall PW1, the second partition wall PW2, and the third partition wall PW3 may control flow of a material of the organic encapsulation layer 320 during a process of forming the encapsulation layer 300. For example, the organic encapsulation layer 320 may be formed by coating a monomer in the display area DA through a process such as inkjet, etc. and then hardening the monomer. A partition wall may control the position of the organic encapsulation layer 320 by controlling the flow of the monomer. With regard to this, it is shown in FIGS. 6A and 6B that an edge 320e of the organic encapsulation layer 320 is positioned on or at one side of the first partition wall PW1. In another embodiment, the edge 320e of the organic encapsulation layer 320 is positioned on the top surface of the first partition wall PW1, and thus, a portion of the organic encapsulation layer 320 may overlap the top surface of the first partition wall PW1. In another embodiment, the edge 320e of the organic encapsulation layer 320 may be positioned on or at one side of the second partition wall PW2. In this case, a portion of the organic encapsulation layer 320 may overlap the top surface of the first partition wall PW1. The position of the organic encapsulation layer 320 may be determined by using an image that captures the display panel 10 including the organic encapsulation layer 320. The display panel 10 according to an embodiment includes the plurality of partition walls, and thus, may be used in monitoring the position of the organic encapsulation layer 320, for example, the position of the edge 320e of the organic encapsulation layer 320.

The edge 320e of the organic encapsulation layer 320 is positioned on one side of one of the partition walls, for example, the first partition wall PW1, and thus, the second inorganic encapsulation layer 330 may contact (e.g., directly contact) the first inorganic encapsulation layer 310 in the intermediate area MA. For example, the first inorganic encapsulation layer 310 may contact (e.g., directly contact) the second inorganic encapsulation layer 330 in a region between the edge 320e of the organic encapsulation layer 320 and the opening 10H of the display panel 10. In an embodiment, it is shown in FIGS. 6A and 6B that the first inorganic encapsulation layer 310 contacts (e.g., directly contacts) the second inorganic encapsulation layer 330 in a region between the first partition wall PW1 and the opening 10H of the display panel 10.

Insulating layers of the input-sensing layer 40, for example, the first sub-insulating layer 41a and the second sub-insulating layer 41b, the second insulating layer 43, and the third insulating layer 45 may extend to cover the intermediate area MA.

A planarization insulating layer 47 (or a planarization layer) may cover the intermediate area MA. The planarization insulating layer 47 may be arranged in the intermediate area MA to have a width ranging from a first edge 47E1 to a second edge 47E2. Accordingly, in a plan view, the planarization insulating layer 47 may have a closed loop shape (e.g., a doughnut shape) surrounding the opening 10H.

The first edge 47E1 of the planarization insulating layer 47 may face the opening 10H of the display panel 10, and the second edge 47E2 of the planarization insulating layer 47 may neighbor the display area DA. A portion of the planarization insulating layer 47 that neighbors the display area DA may overlap a portion of the organic encapsulation layer 320 while covering the edge 320e of the organic encapsulation layer 320. The second inorganic encapsulation layer 330 and the first sub-insulating layer 41a may be arranged therebetween.

The first sub-insulating layer 41a may contact (e.g., directly contact) the second sub-insulating layer 41b in the display area DA. In contrast, the first sub-insulating layer 41a may be spaced from (e.g., spaced apart from) the second sub-insulating layer 41b in a thickness direction (e.g., a z-direction) due to the planarization insulating layer 47 arranged therebetween in the intermediate area MA.

The second electrode 223 covering (e.g., entirely covering) the display area DA may extend to the intermediate area MA. An edge portion 223ep of the second electrode 223 may be arranged between the display area DA and one of the partition walls. In an embodiment, it is shown in FIGS. 6A and 6B that the edge portion 223ep of the second electrode 223 is arranged between the display area DA and the first partition wall PW1. Here, the edge portion 223ep of the second electrode 223 is a portion of the second electrode 223 that is closest to the opening 10H. In an embodiment, there may not be a layer corresponding to the second electrode 223 in a region ranging from the edge portion 223ep of the second electrode 223 to the opening 10H. In other words, there may not be a layer having the same material and the same structure as the second electrode 223 in a region ranging from the edge portion 223ep of the second electrode 223 to the opening 10H. With regard to this, it is shown in FIGS. 6A, 6B, and 7C that the second electrode 223 includes a first opening portion 223oh surrounded/defined by the edge portion 223ep. The first opening portion 223oh of the second electrode 223 may overlap the opening area OA and a portion of the intermediate area MA close to the opening area OA as shown in FIG. 7C.

The edge portion 223ep of the second electrode 223 may be covered by an organic layer, for example, the organic encapsulation layer 320. The second electrode 223 may be formed by forming a second electrode material layer, and then removing a portion of the second electrode material layer arranged in the intermediate area MA, the second electrode material layer covering (e.g., entirely covering) the display area DA and the intermediate area MA. A portion of the second electrode material layer may be removed through a laser lift-off process. The edge portion 223ep of the second electrode 223 may have an irregular shape due to a laser. For example, as shown in FIG. 7A, the edge portion 223ep of the second electrode 223 may include a burr formed by a laser lift-off process. The edge portion 223ep of the second electrode 223 may extend in an oblique direction to be away from the top surface of the substrate 100. In an embodiment, the edge portion 223ep of the second electrode 223 may be slanted in a direction extending away from the substrate 100. A cross-section thereof may have an irregular unevenness.

The thickness of the first inorganic encapsulation layer 310 on the second electrode 223 may not be constant due to the shape of the edge portion 223ep of the second electrode 223. For example, as shown in FIG. 7A, the first inorganic encapsulation layer 310 may include a top surface that is convex upward along the shape of the edge portion 223ep of the second electrode 223.

The first inorganic encapsulation layer 310 has an excellent step coverage, but the edge portion 223ep of the second electrode 223 under the first inorganic encapsulation layer 310 has an irregular shape, and thus, the first inorganic encapsulation layer 310 may include a portion having a small density and/or a portion having a small thickness locally. In this case, a crack may occur to the first inorganic encapsulation layer 310 and be transferred to the neighborhood (e.g., the crack may grow in size and/or propagate into the surrounding area). However, according to an embodiment, the organic encapsulation layer 320 covers the edge portion 223ep of the second electrode 223, and thus, the crack issue may be prevented or substantially prevented.

At least one organic layer 222o (referred to as an organic layer, hereinafter) included in the intermediate layer 222, for example, the first functional layer 222a and/or the second functional layer 222c may be disconnected in the intermediate area MA. In other words, a portion of the organic layer 222o may be removed from the intermediate area MA, and thus, the organic layer 222o may include a second opening portion 222oh arranged in the intermediate area MA. With regard to this, FIGS. 6A and 6B show a plurality of second opening portions 222oh (e.g., a plurality of second opening portions 222oh corresponding to a plurality of second openings) in the intermediate area MA. The organic layer 222o may include the first functional layer 222a and the second functional layer 222c. An opening portion 222ah of the first functional layer 222a may overlap an opening portion 222ch of the second functional layer 222c to constitute the second opening portion 222oh. The opening portion 222ah of the first functional layer 222a and the opening portion 222ch of the second functional layer 222c may be formed by removing a portion of the first functional layer 222a and the second functional layer 222c. Due to the opening portions 222ah and 222ch, the first functional layer 222a and the second functional layer 222c may be discontinuous (e.g., the continuity of the layers may be interrupted by corresponding opening portions) in the intermediate area MA.

An insulating layer, for example, the buffer layer 201 arranged under the second opening portion 222oh may be exposed through the second opening portion 222oh. The first inorganic encapsulation layer 310 may contact (e.g., directly contact) the buffer layer 201 through the second opening portion 222oh. The buffer layer 201 may include an inorganic insulating material. The contact between the first inorganic encapsulation layer 310 and the buffer layer 201 may locally block or reduce the progression of moisture.

The at least one organic layer 222o of the intermediate layer 222 covers (e.g., entirely covers) the display area DA, and thus, may provide a path for moisture that may be introduced to the at least one organic layer 222o of the intermediate layer 222 through the opening 10H of the display panel 10. In contrast, according to an embodiment, the organic layer 222o includes the second opening portion 222oh arranged in the intermediate area MA, and thus, the progression of moisture through the organic layer 222o may be prevented or reduced.

The second opening portions 222oh of the organic layer 222o may be spaced from (e.g., spaced apart from) each other in a region ranging from the edge portion 223ep of the second electrode 223 to the opening 10H. At least one of the second opening portions 222oh may be arranged between neighboring (e.g., adjacent) partition walls, between the third partition wall PW3 and the opening 10H, and/or between the first partition wall PW1 and the display area DA.

In an embodiment, FIGS. 6A and 6B show the second opening portion 222oh between the first partition wall PW1 and the display area DA, the second opening portion 222oh between the first partition wall PW1 and the second partition wall PW2, the second opening portion 222oh between the second partition wall PW2 and the third partition wall PW3, and the second opening portions 222oh between the third partition wall PW3 and the opening 10H.

The organic layer 222o may include organic portions 222op that are separated from each other by the second opening portions 222oh. The organic portions 222op may be spaced from (e.g., spaced apart from) each other in the intermediate area MA. The organic portions 222op may include, for example, a portion 222ap of the first functional layer 222a and/or a portion 222cp of the second functional layer 222c.

In the case where the second opening portions 222oh are formed between neighboring (e.g., adjacent) partition walls, each of the first to third partition walls PW1, PW2, and PW3 may overlap the organic portion 222op or be covered by the organic portion 222op. The organic portion 222op is not covered by the second electrode 223 and may be covered (e.g., directly covered) by a layer formed on the second electrode 223, for example, the first inorganic encapsulation layer 310. In other words, the first inorganic encapsulation layer 310 may contact (e.g., directly contact) the top surface of the organic portion 222op.

Each of the second opening portions 222oh may surround the opening 10H in a plan view. For example, each of the second opening portions 222oh may extend along the edge of the opening 10H and have a closed-loop shape surrounding (e.g., entirely surrounding) the opening 10H in a plan view.

The second opening portions 222oh may be spaced from (e.g., spaced apart from) each other. Accordingly, the organic portions 222op separated from each other by the second opening portions 222oh may also have a closed-loop shape surrounding (e.g., entirely surrounding) the opening area OA in a plan view as shown in FIG. 7B.

Referring to FIGS. 6A, 6B, 7B, and 7C, the organic layer 222o may include the plurality of second opening portions 222oh. In contrast, the second electrode 223 may include a single first opening portion 223oh. The single first opening portion 223oh of the second electrode 223 may overlap (e.g., overlap in a plan view or in a thickness direction of the display panel 10) the plurality of second opening portions 222oh. In other words, the organic portions 222op that are separated from each other by the second opening portions 222oh may be arranged inside the single first opening portion 223oh.

FIGS. 8A-8E are cross-sectional views showing a process of a manufacturing the display panel 10 according to an embodiment.

Figure 8A:
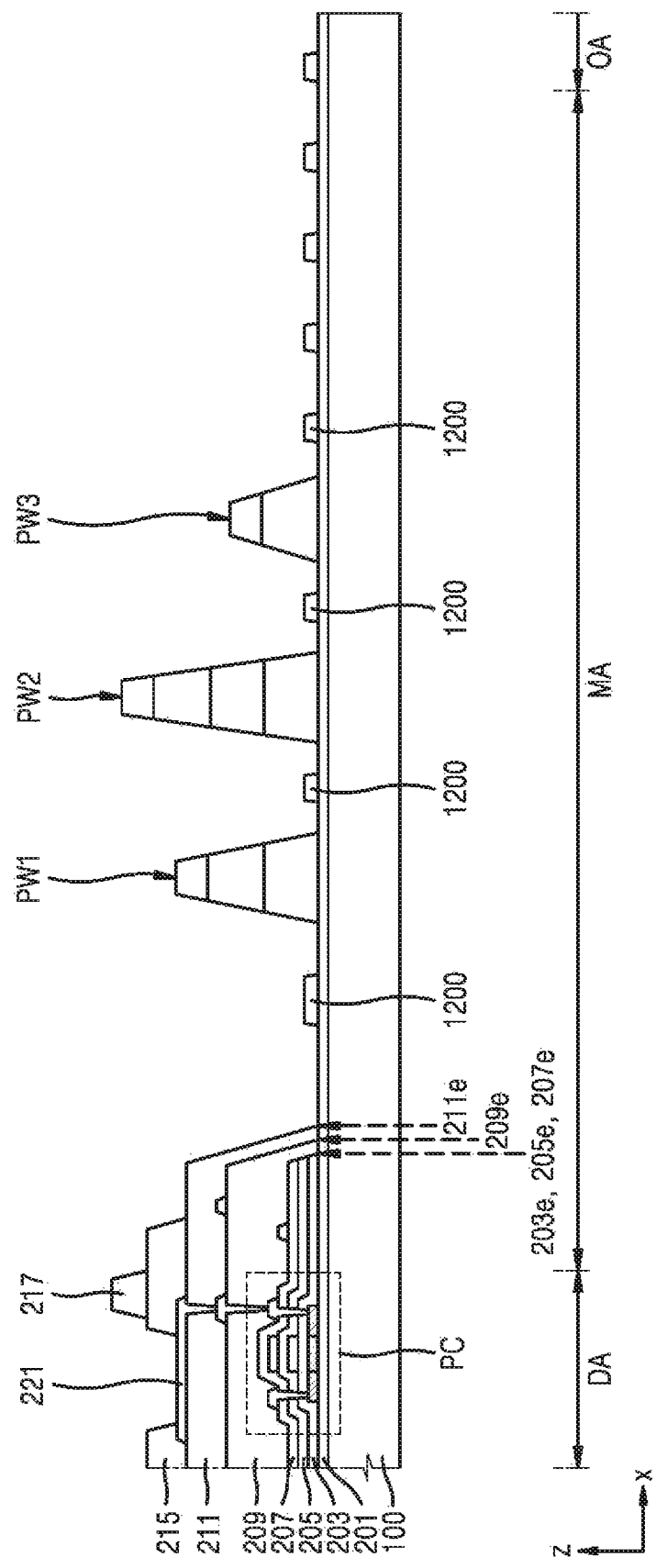
FIGS. 8A-8E are cross-sectional views showing a process of manufacturing a display panel according to an embodiment.

First, referring to FIG. 8A, the pixel circuit PC, the first electrode 221 on the pixel circuit PC, and at least one partition wall are formed over the substrate 100. Before the pixel circuit PC is formed, the buffer layer 201 may be formed to cover (e.g., entirely cover) the top surface of the substrate 100. Then, a semiconductor layer of a thin-film transistor, the gate insulating layer 203, a gate electrode of the thin-film transistor, a bottom electrode of a storage capacitor, the first interlayer insulating layer 205, a top electrode of the storage capacitor, the second interlayer insulating layer 207, a source electrode, a drain electrode, the first intermediate insulating layer 209, a contact metal layer, and the second intermediate insulating layer 211 may be formed (e.g., sequentially formed).

The buffer layer 201 may cover the entire substrate 100. In contrast, a portion of at least one insulating layer on the buffer layer 201 may be removed. For example, each of the gate insulating layer 203, the first interlayer insulating layer 205, the second interlayer insulating layer 207, the first intermediate insulating layer 209, and the second intermediate insulating layer 211 formed in the opening area OA and a portion of the intermediate area MA that neighbors the opening area OA may be removed. Accordingly, as shown in FIG. 8A, edges 203e, 205e, and 207e of the gate insulating layer 203, the first interlayer insulating layer 205, and the second interlayer insulating layer 207 that face the opening area OA and/or neighbor the opening area OA may be spaced from (e.g., spaced apart from) the first partition wall PW1 and be covered by the first intermediate insulating layer 209. Similarly, edges 209e and 211e of the first intermediate insulating layer 209 and the second intermediate insulating layer 211 that face the opening area OA and/or neighbor the opening area OA may be spaced from (e.g., spaced apart from) the first partition wall PW1. The edge 209e of the first intermediate insulating layer 209 may be covered by the second intermediate insulating layer 211.

The first electrode 221 may be formed on the second intermediate insulating layer 211. The upper insulating layer 215 and the spacer 217 may be formed on the first electrode 221. While the first electrode 221 is formed in the display area DA, a plurality of auxiliary layers 1200 may be formed in the intermediate area MA. While insulating material layers including the organic insulating material are formed in the display area DA, at least one partition wall may be formed in the intermediate area MA.

The auxiliary layers 1200 may include the same material as the first electrode 221 and concurrently (e.g., simultaneously) formed during the same process of forming the first electrode 221. For example, the auxiliary layer 1200 may include metal and transparent conductive oxides such as ITO/Ag/ITO.

At least one partition wall, for example, the first to third partition walls PW1, PW2, and PW3 may each have a cross-sectional shape in which a bottom width is greater than a top width. The first to third partition walls PW1, PW2, and PW3 may each include a plurality of sub-layers. Each sub-layer may be concurrently (e.g., simultaneously) formed during a process of forming the first intermediate insulating layer 209, the second intermediate insulating layer 211, the upper insulating layer 215, and/or the spacer 217. The materials of the sub-layers of the first to third partition walls PW1, PW2, and PW3 are the same as those described above with reference to FIGS. 6A and 6B.

The auxiliary layers 1200 may be arranged in the intermediate area MA and/or the opening area OA. For example, one auxiliary layer 1200 may be arranged between display area DA and the first partition wall PW1, one auxiliary layer 1200 may be arranged between the first partition wall PW1 and the second partition wall PW2 that neighbor each other (e.g., are adjacent to each other), and one auxiliary layer 1200 may be arranged between the second partition wall PW2 and the third partition wall PW3 that neighbor each other (e.g., are adjacent to each other). A horizontal distance between the third partition wall PW3 and the opening area OA may be greater than a horizontal distance between neighboring (e.g., adjacent) partition walls. Accordingly, a plurality of auxiliary layers 1200 may be arranged between the third partition wall PW3 and the opening area OA. The auxiliary layer 1200 may be arranged also in the opening area OA. The widths of the auxiliary layers 1200 may be different from each other or may be the same.

Figure 8B:
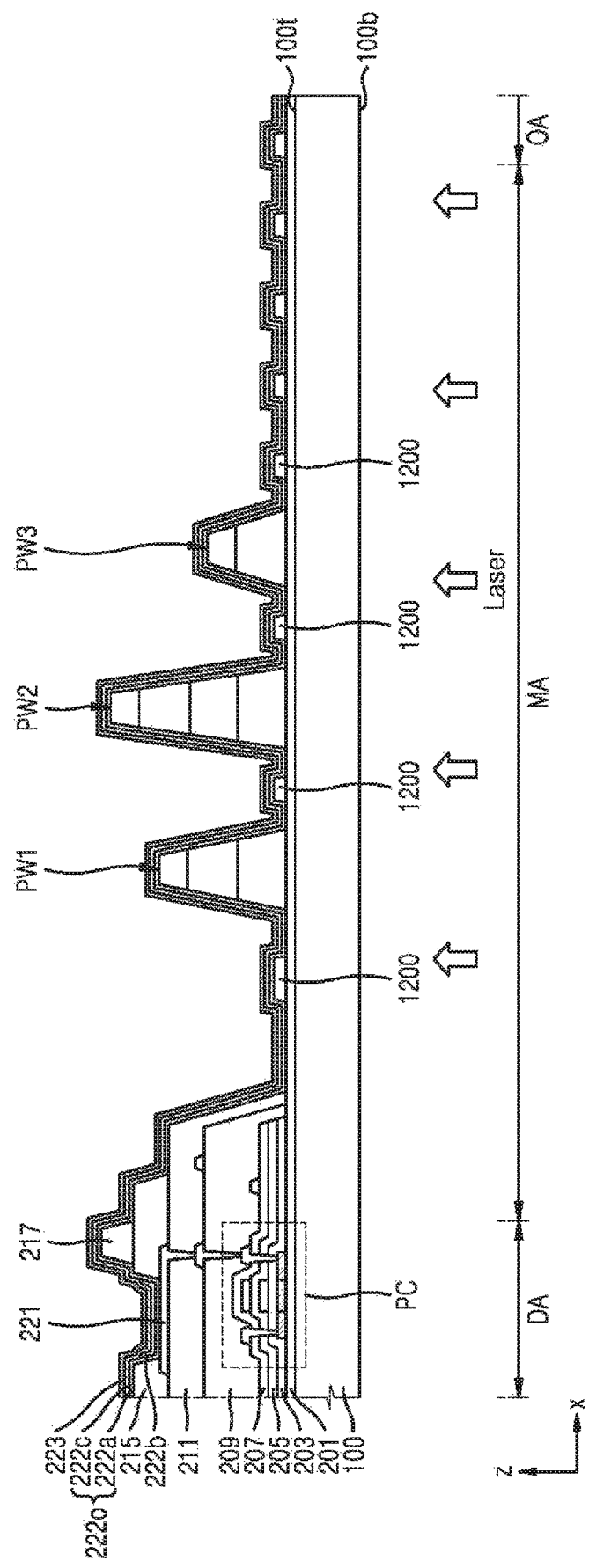

Then, as shown in FIG. 8B, the first functional layer 222a, the emission layer 222b, the second functional layer 222c, and the second electrode 223 may be formed on the first electrode 221. The emission layer 222b is formed to correspond to the first electrodes 221 spaced from (e.g., spaced apart from) each other in the display area DA. In contrast, the organic layer 222o (e.g., the first functional layer 222a and/or the second functional layer 222c) and the second electrode 223, which are common layers, may be formed to cover the entire substrate 100 as shown in FIG. 8B.

In the case where the organic layer 222o and the second electrode 223 cover the entire top surface of the substrate 100, a crack may occur or moisture may be introduced to the light-emitting diode. Accordingly, a portion of the organic layer 222o and a portion of the second electrode 223 may be removed from the intermediate area MA. For this purpose, the substrate 100 may be irradiated with a laser. The substrate 100 may be irradiated with the laser in a direction from the backside 100b of the substrate 100 to the top surface 100t of the substrate 100. The power of the laser may be set based on a band gap of the second electrode 223. Laser irradiation may be provided once or multiple times. In the case where the laser irradiation is provided multiple times, the kind, the power, and/or the irradiation range (or the size of the laser beam) of the laser may be changed. A portion of the second electrode 223 that is arranged in the intermediate area MA may be removed by the laser (e.g., a laser lift-off process).

During the laser lift-off process, the auxiliary layer 1200 may absorb the laser to be heated to a temperature (e.g., a preset temperature). A portion of the organic layer 222o, for example, portions of the first functional layer 222a and the second functional layer 222c that correspond to the auxiliary layer 1200 may be removed. The auxiliary layer 1200 is a kind of sacrificial layer. After the portions of the organic layer 222o are removed (e.g., after the second opening portions 222oh are formed in the organic layer 222o), the auxiliary layer 1200 may be removed as shown in FIG. 8C.

Figure 8C:
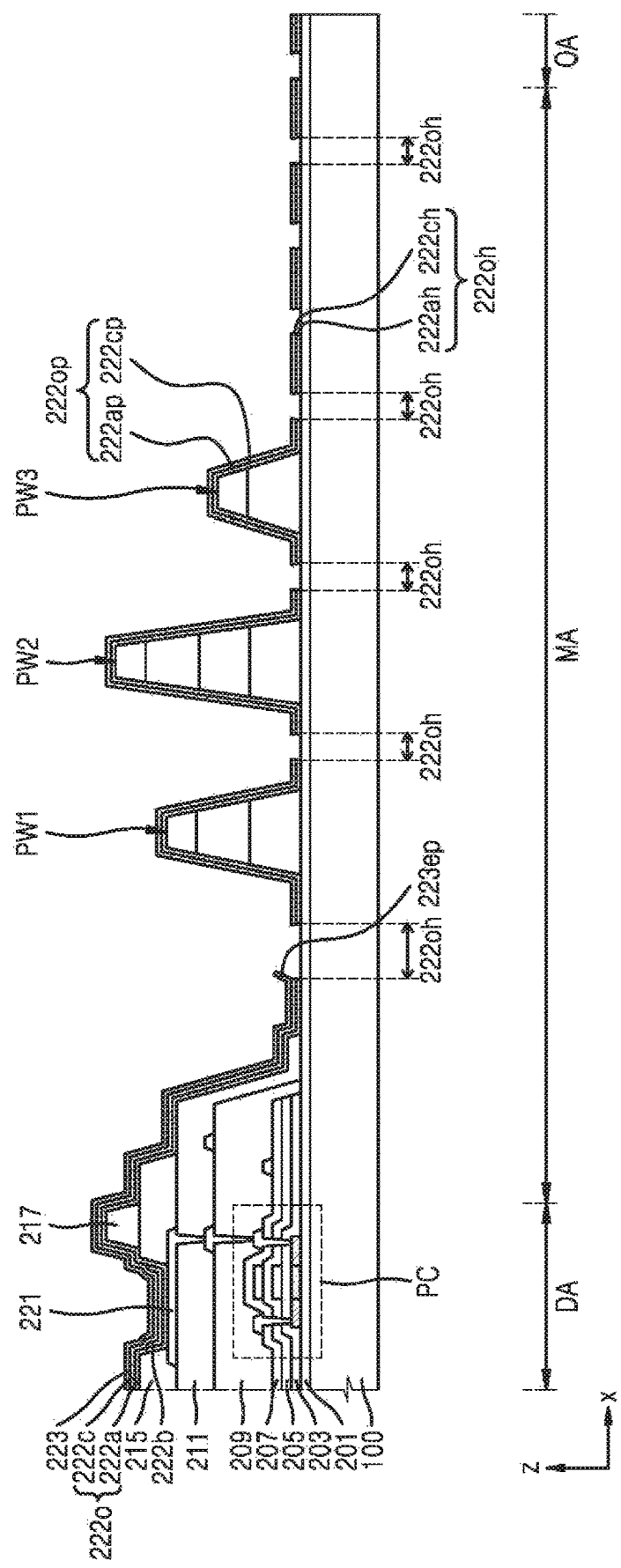

It is shown in FIG. 8C that the edge portion 223ep of the second electrode 223 is arranged between the display area DA and one of the partition walls (e.g., the first partition wall PW1) by the laser lift-off process. The organic layer 222o may include second opening portions 222oh arranged in the intermediate area MA and the opening area OA, and include the organic portions 222op separated from each other by the second opening portions 222oh. In the case where the organic layer 222o includes the first and second functional layers 222a and 222c, the second opening portion 222oh of the organic layer 222o may include the opening portion 222ah of the first functional layer 222a and the opening portion 222ch of the second functional layer 222c. The organic portion 222op of the organic layer 222o may include the portion 222ap of the first functional layer 222a and the portion 222cp of the second functional layer 222c.

Though it is shown in FIG. 8C that an edge portion 223ep of the second electrode 223 is arranged between the display area DA and the first partition wall PW1, and the second opening portion 222oh is arranged in a region ranging from the edge portion 223ep of the second electrode 223 to the opening area OA, the present disclosure is not limited thereto. The positions of the first opening portion 223oh of the second electrode 223, the second opening portion 222oh of the organic layer 222o, and the edge portion 223ep of the second electrode 223 may be variously changed in a suitable manner according to the number of auxiliary layers 1200, the position of the auxiliary layer 1200, and/or an irradiation range of the laser. In another embodiment, the edge portion 223ep of the second electrode 223 may be arranged between the first partition wall PW1 and the second partition wall PW2, between the second partition wall PW2 and the third partition wall PW3, or between the third partition wall PW3 and the opening area OA. The second opening portion 222oh of the organic layer 222o may be arranged in a region ranging from the edge portion 223ep of the second electrode 223 to the opening area OA.

Figure 8D:
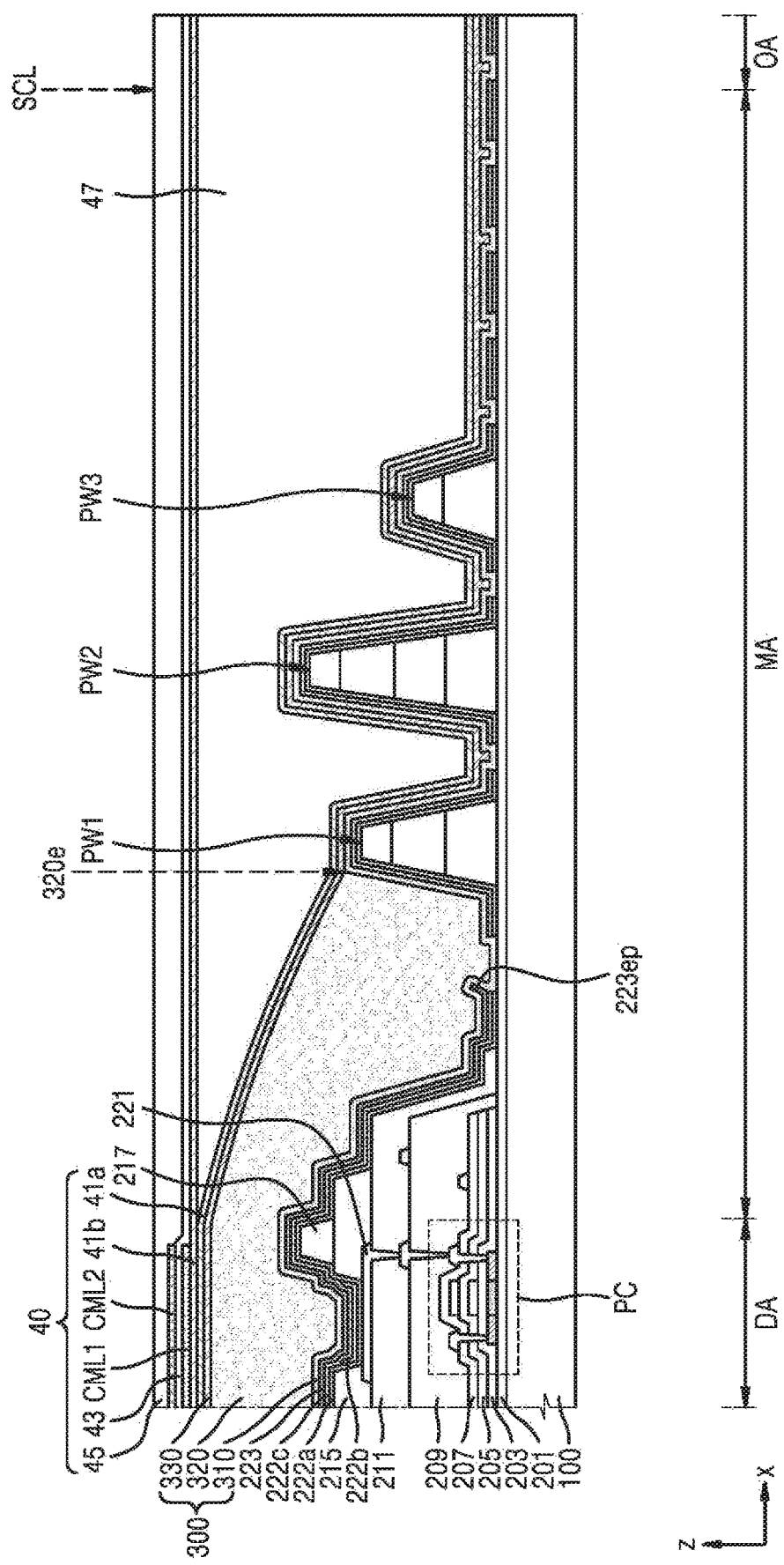

Referring to FIG. 8D, the encapsulation layer 300 and the input-sensing layer 40 may be formed over the substrate 100 on which the structure described with reference to FIG. 8C is formed.

The first inorganic encapsulation layer 310 of the encapsulation layer 300 may be formed to cover the entire substrate 100. The first inorganic encapsulation layer 310 may be formed through chemical vapor deposition. The auxiliary layer 1200 between neighboring (e.g., adjacent) partition walls is removed from the structure described with reference to FIG. 8C, and thus, the first inorganic encapsulation layer 310 may contact (e.g., directly contact) the inorganic insulating layer thereunder, for example, the buffer layer 201.

The first inorganic encapsulation layer 310 has a relatively excellent step coverage, and thus, may cover the edge portion 223ep of the second electrode 223 that is obliquely floated in an upward direction. In an embodiment, the edge portion 223ep of the second electrode 223 may be slanted in a direction extending away from the substrate 100. The edge portion 223*ep* of the second electrode 223 is a kind of burr and has an irregular shape, and thus, even though the first inorganic encapsulation layer 310 covers the edge portion 223*ep* of the second electrode 223, a probability that a crack occurs may be relatively high. However, the edge portion 223*ep* of the second electrode 223 is covered by the organic encapsulation layer 320, and thus, the above issue may be reduced, minimized, or prevented.

The organic encapsulation layer 320 may cover particles remaining on the second electrode 223 from among particles occurring during the laser lift-off process. As described above, the positions of the first opening portion 223*oh* of the second electrode 223, the second opening portion 222*oh* of the organic layer 222*o*, and the edge portion 223*ep* of the second electrode 223 may be variously changed in a suitable manner according to the number of auxiliary layers 1200, the position of the auxiliary layer 1200, and/or an irradiation range of the laser. In another embodiment, though the edge 320*e* of the organic encapsulation layer 320 is arranged on or at one side of the first partition wall PW1 as shown in FIG. 8D, the edge portion 223*ep* of the second electrode 223 may be arranged between the third partition wall PW3 and the opening area OA. In this case, the edge portion 223*ep* of the second electrode 223 may be arranged closer to the opening area OA than the edge 320*e* of the organic encapsulation layer 320 is to the opening area OA. Particles occurring during the laser lift-off process may remain on the second electrode 223. In the case where the edge portion 223*ep* of the second electrode 223 extends further toward the opening area OA than the edge 320*e* of the organic encapsulation layer 320 extends to the opening area OA, particles remaining on a portion of the second electrode 223 that is not covered by the organic encapsulation layer 320 may not only deteriorate the quality of the first inorganic encapsulation layer 310 but deteriorate even the quality of a layer of the second inorganic encapsulation layer 330 that contacts (e.g., directly contacts) the first inorganic encapsulation layer 310 locally. Accordingly, as shown in FIG. 8D, the edge portion 223*ep* of the second electrode 223 is arranged closer to the display area DA than the edge 320*e* of the organic encapsulation layer 320 is to the display area DA, and the top surface of the second electrode 223 is covered (e.g., entirely covered) by the organic encapsulation layer 320 in the intermediate area MA. In other words, the edge 320*e* of the organic encapsulation layer 320 may be arranged between the edge portion 223*ep* of the second electrode 223 and the opening 10H.

The organic encapsulation layer 320 may be formed by coating a monomer through an inkjet method, etc. and then hardening the same. The organic encapsulation layer 320 may include a resin formed while the monomer is hardened. The material of the organic encapsulation layer 320 is the same described above.

The second inorganic encapsulation layer 330 is formed on the organic encapsulation layer 320. Like the first inorganic encapsulation layer 310, the second inorganic encapsulation layer 330 may be formed through chemical vapor deposition. The second inorganic encapsulation layer 330 may contact (e.g., directly contact) the first inorganic encapsulation layer 310 in a portion of the intermediate area MA in which the organic encapsulation layer 320 is not formed, and the opening area OA. For example, the second inorganic encapsulation layer 330 may contact (e.g., directly contact) the first inorganic encapsulation layer 310 between the edge 320*e* of the organic encapsulation layer 320 and the opening area OA, and thus, reduce or prevent a probability of moisture transmission even more.

Then, the first sub-insulating layer 41*a* may be formed and the planarization insulating layer 47 may be formed on the first sub-insulating layer 41*a*. The planarization insulating layer 47 may be formed in the intermediate area MA and the opening area OA. The organic encapsulation layer 320 is arranged to cover the display area DA. In contrast, the planarization insulating layer 47 may not cover the display area DA. During the manufacturing process shown in FIG. 8D, there may be the planarization insulating layer 47 only in the intermediate area MA and the opening area OA.

Next, the second sub-insulating layer 41*b* is formed, and the first conductive layer CML1, the second insulating layer 43, the second conductive layer CML2, and the third insulating layer 45 may be formed (e.g., sequentially formed).

Figure 8E:
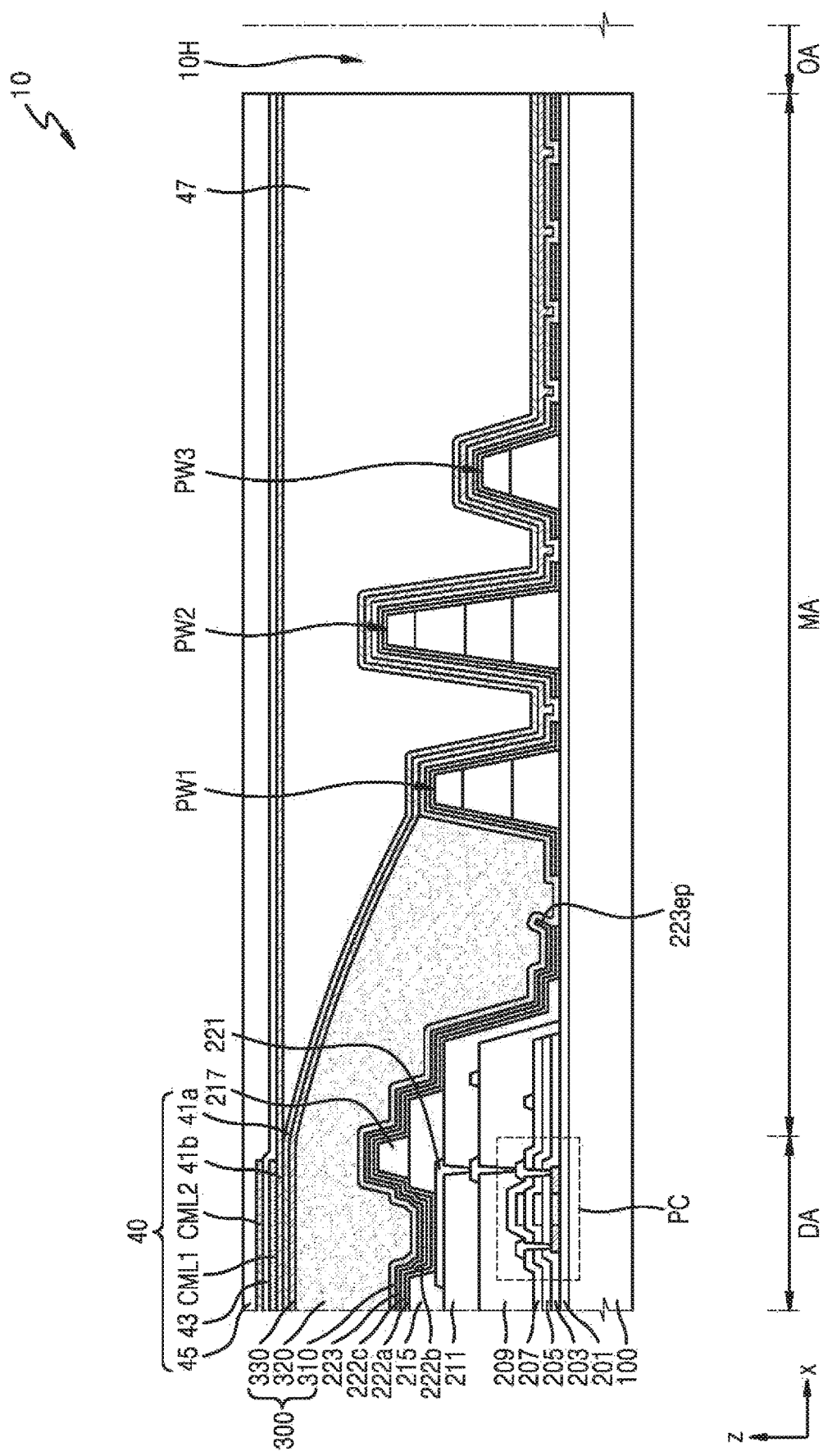

Then, when the opening area OA is cut along a cutting line SCL by using laser cutting, etc., the display panel 10 may include the opening 10H formed in the opening area OA as shown in FIG. 8E.

Figure 9:
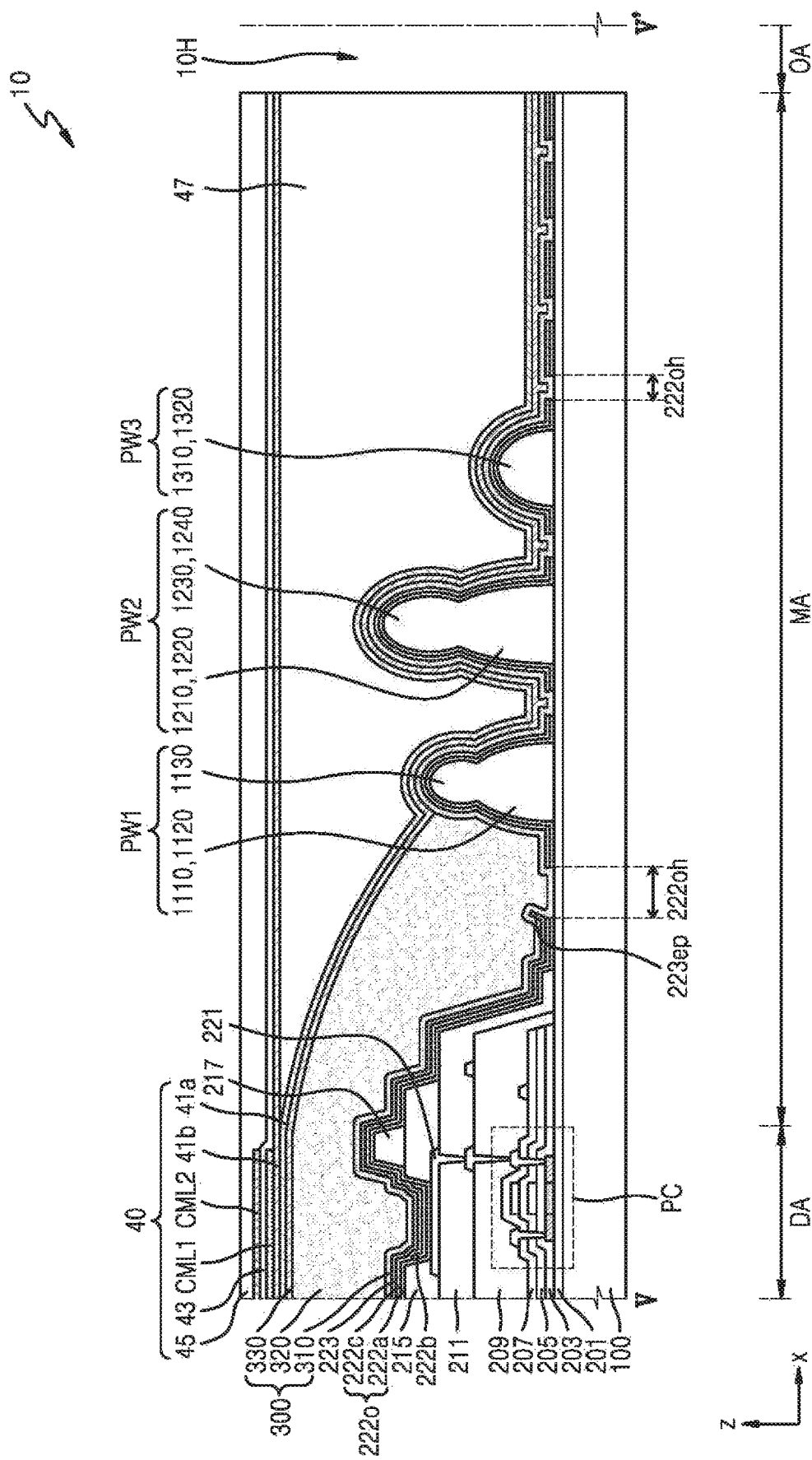
FIG. 9 is a cross-sectional view of a display panel according to an embodiment, taken along the line V-V of FIG. 5.

FIG. 9 is a cross-sectional view of the display panel 10 according to an embodiment, taken along the line V-V of FIG. 5. Referring to FIG. 9, a specific shape of a partition wall is different from that of the embodiment described above with reference to FIGS. 6A-8E. Specific characteristics of other configurations except for the shape of the partition wall are the same as or similar to those described with reference to FIGS. 6A and 6B.

At least one partition wall, for example, the first to third partition walls PW1, PW2, and PW3 have a shape in which a lower width (e.g., a bottom width) thereof is greater than a top width thereof, but there may be a step difference between a top and a bottom of the partition wall as shown in FIG. 9. For example, as shown in FIG. 9, the first partition wall PW1 and/or the second partition wall PW2 may include a width at a portion between the top and the bottom that is less than the top width and the lower width (e.g., the bottom width). In another embodiment, the first to third partition walls PW1, PW2, and PW3 have a width that gradually increases from the top to the bottom.

The (1-1)st sub-partition wall layer 1110 and the (1-2)nd sub-partition wall layer 1120 of the first sub-partition wall layers of the first partition wall PW1 form the bottom of the first partition wall PW1 having a relatively large width. The (1-3)rd sub-partition wall layer 1130 may form the top of the first partition wall PW1 having a relatively small width. The bottom and the top of the first partition wall PW1 may have a step difference in a cross-sectional view. For example, the first partition wall PW1 may not have a shape having a width that gradually decreases in a direction from the bottom to the top and may have a shape having a width that remarkably decreases at a step difference portion.

The (2-1)st sub-partition wall layer 1210 and the (2-2)nd sub-partition wall layer 1220 of the second sub-partition wall layer of the second partition wall PW2 may form the bottom of the second partition wall PW2 having a relatively large width. The (2-3)rd sub-partition wall layer 1230 and the (2-4)th sub-partition wall layer 1240 may form the top of the second partition wall PW2 having a relatively small width. Like the first partition wall PW1, the bottom and the top of the second partition wall PW2 may have a step difference in a cross-sectional view.

Unlike the first and second partition walls PW1 and PW2, the (3-1)st sub-partition wall layer 1310 and the (3-2)nd sub-partition wall layer 1320 of the third sub-partition wall layer of the third partition wall PW3 may not have a step difference.

Figure 10:
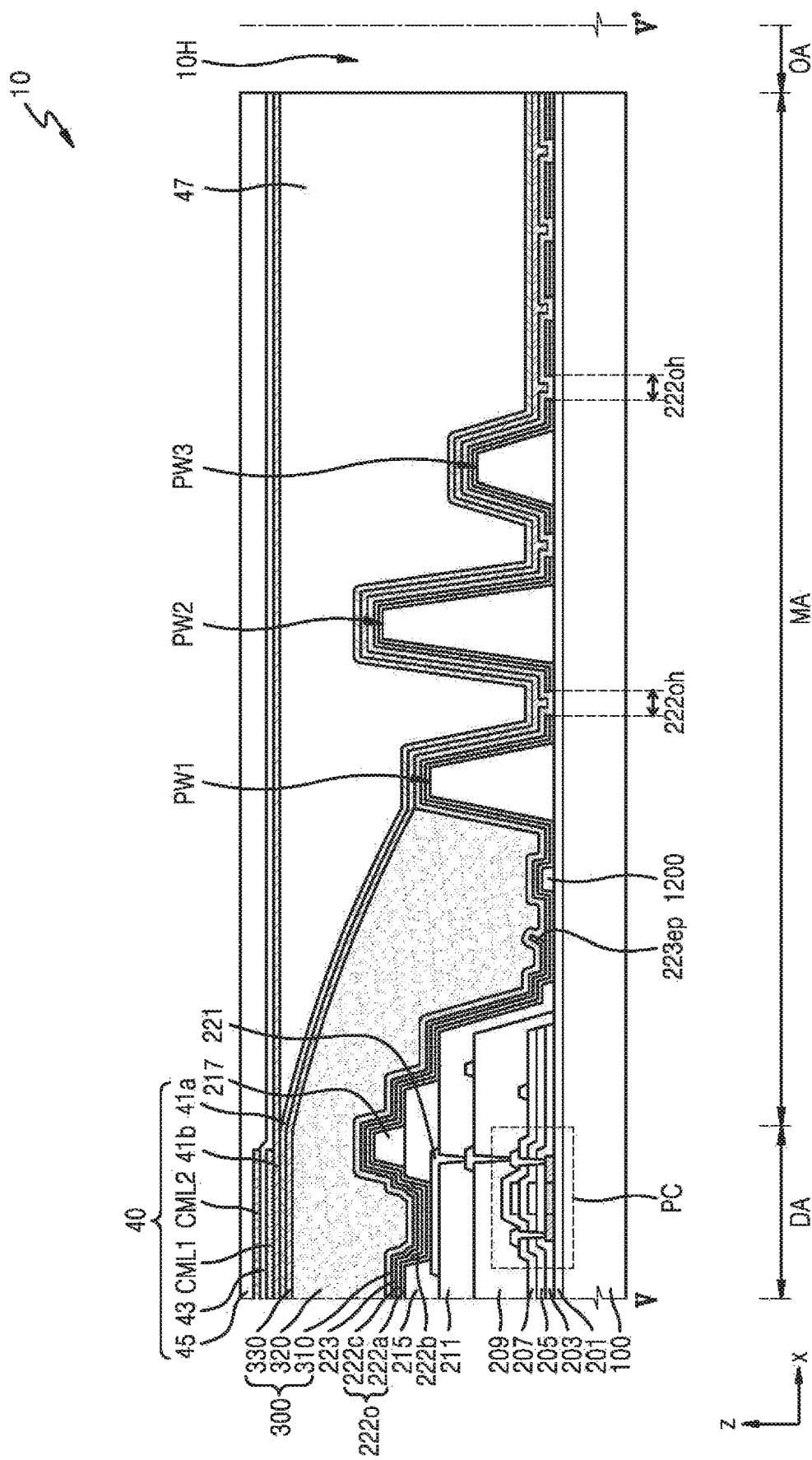
FIG. 10 is a cross-sectional view of a display panel according to an embodiment, taken along the line V-V of FIG. 5.

FIG. 10 is a cross-sectional view of the display panel 10 according to an embodiment, taken along the line V-V of FIG. 5.

According to the embodiment described above with reference to FIGS. 6A-9, though it is shown that the auxiliary layer 1200 is completely removed during the process of manufacturing the display panel 10, at least one auxiliary layer 1200 may remain on the substrate 100. With regard to this, it is shown in FIG. 10 that the auxiliary layer 1200 is arranged between the display area DA and the first partition wall PW1. The auxiliary layer 1200 arranged between the display area DA and the first partition wall PW1 may be covered by the organic encapsulation layer 320.

The auxiliary layer 1200 may be used to track or monitor the position of the organic encapsulation layer 320. In an embodiment, the position of the monomer and/or the organic encapsulation layer 320 may be determined through a microscope image (e.g., an image provided by a microscope). In the case where the auxiliary layer 1200 including a reflective metal is positioned closer to the display area DA than the first partition wall PW1 is to the display area DA, light is reflected from the auxiliary layer 1200, and thus, the position of the monomer and/or the organic encapsulation layer 320 may be easily tracked.

The edge portion 223ep of the second electrode 223 may be spaced from (e.g., spaced apart from) the auxiliary layer 1200 as shown in FIG. 10. For example, the auxiliary layer 1200 may be arranged between the edge portion 223ep of the second electrode 223 and the first partition wall PW1. In another embodiment, the edge portion 223ep of the second electrode 223 may overlap the auxiliary layer 1200 according to the specification of the laser and/or the number of times of laser irradiation. For example, the edge portion 223ep of the second electrode 223 may be arranged on the auxiliary layer 1200 and may overlap the auxiliary layer 1200.

According to the embodiment described above with reference to FIGS. 6A-9, though it is shown that the second opening portion 222oh of the organic layer 222o is arranged between the display area DA and the first partition wall PW1, it is shown in FIG. 10 that a functional layer covering the entire display area DA extends to the intermediate area MA to pass across the first partition wall PW1 in another embodiment. The organic layer 222o, for example, the first and second functional layers 222a and 222c may not include an opening portion between the display area DA and the first partition wall PW1, and the auxiliary layer 1200 may be covered by the first and second functional layers 222a and 222c.

Figure 11:
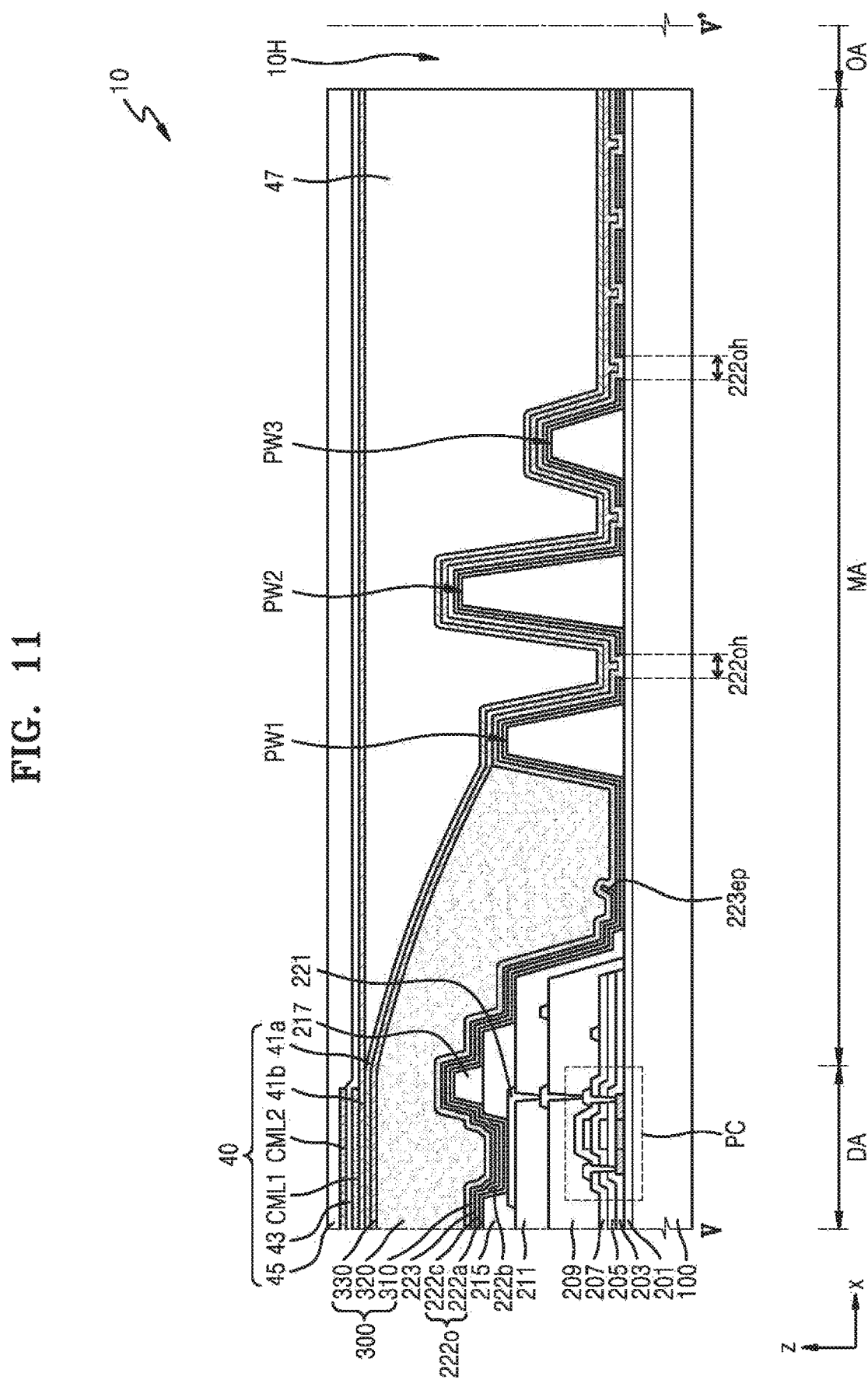
FIG. 11 is a cross-sectional view of a display panel according to an embodiment, taken along the line V-V of FIG. 5.

FIG. 11 is a cross-sectional view of the display panel 10 according to an embodiment, taken along the line V-V of FIG. 5.

According to the embodiment of FIG. 11, the organic layer 222o arranged in the display area DA may continuously extend to the first partition wall PW1 of the intermediate area MA as described with reference to FIG. 10. Unlike the embodiment of FIG. 10, it is shown in FIG. 11 that there is no auxiliary layer 1200 between the display area DA and the first partition wall PW1. When forming the auxiliary layer 1200 from among the process of manufacturing the display panel 10 described above with reference to FIGS. 8A-8E, the auxiliary layer 1200 may not be formed between the display area DA and the first partition wall PW1, and thus, the display panel 10 having the structure shown in FIG. 11 may be formed.

Figure 12:
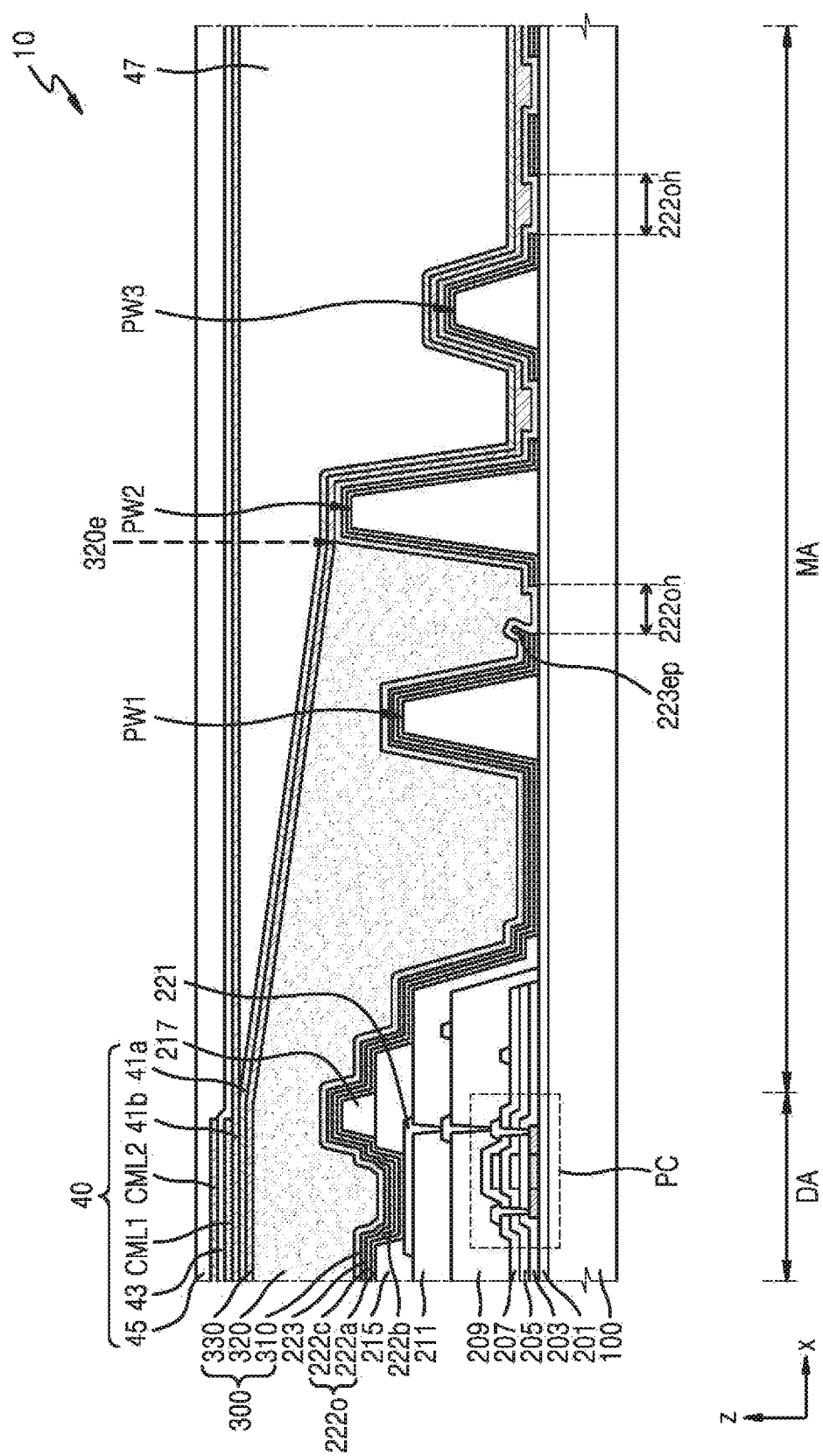
FIG. 12 is a cross-sectional view of a portion of a display area and a portion of an intermediate area of a display panel according to an embodiment.

FIG. 12 is a cross-sectional view of the display panel 10 according to an embodiment. FIG. 12 shows a portion of the display area DA and a portion of the intermediate area MA.

Referring to FIG. 12, the second electrode 223 of the display area DA extends to the intermediate area MA, and the edge portion 223ep of the second electrode 223 may be arranged between two neighboring (e.g., adjacent) partition walls. As shown in FIG. 12, the second electrode 223 may extend toward the opening 10H to pass across the first partition wall PW1, and the edge portion 223ep of the second electrode 223 may be arranged between the first partition wall PW1 and the second partition wall PW2.

The organic layer 222o, for example, the first and second functional layers 222a and 222c includes the second opening portions 222oh. The second opening portions 222oh may be arranged in a region ranging from the edge portion 223ep of the second electrode 223 to the opening 10H.

The encapsulation layer 300 is formed over the substrate 100. As described above, the first and second inorganic encapsulation layers 310 and 330 of the encapsulation layer 300 may be continuously formed to cover the display area DA and the intermediate area MA. The organic encapsulation layer 320 may cover the edge portion 223ep of the second electrode 223. With regard to this, it is shown in FIG. 12 that the organic encapsulation layer 320 is arranged close to the second partition wall PW2 while covering the first partition wall PW1. The edge 320e of the organic encapsulation layer 320 may be arranged on or at one side of the second partition wall PW2 as shown in FIG. 12, or arranged on the top surface of the second partition wall PW2 in another embodiment.

Figure 13:
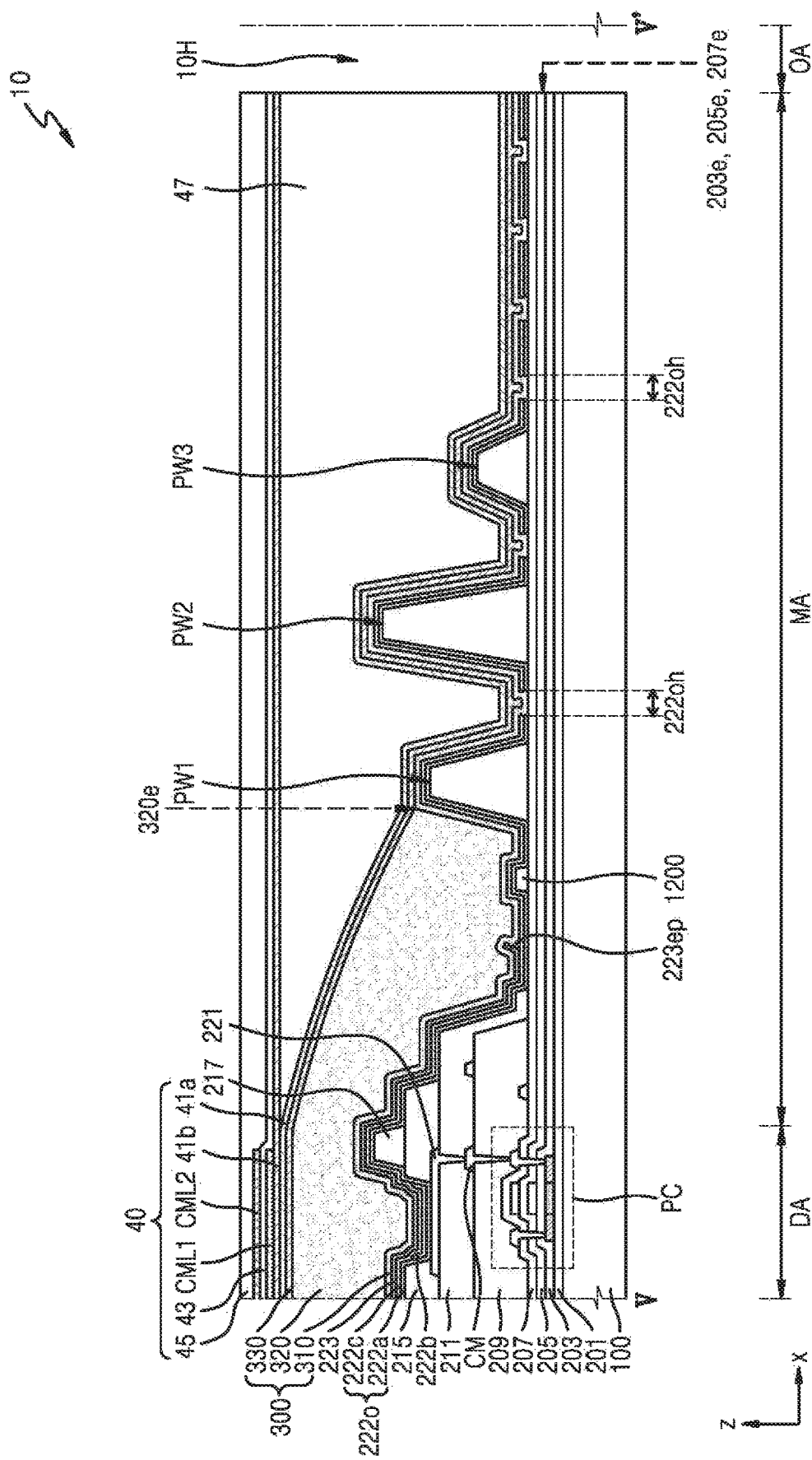
FIG. 13 is a cross-sectional view of a display panel according to an embodiment, taken along the line V-V' of FIG. 5.
Figure 14:
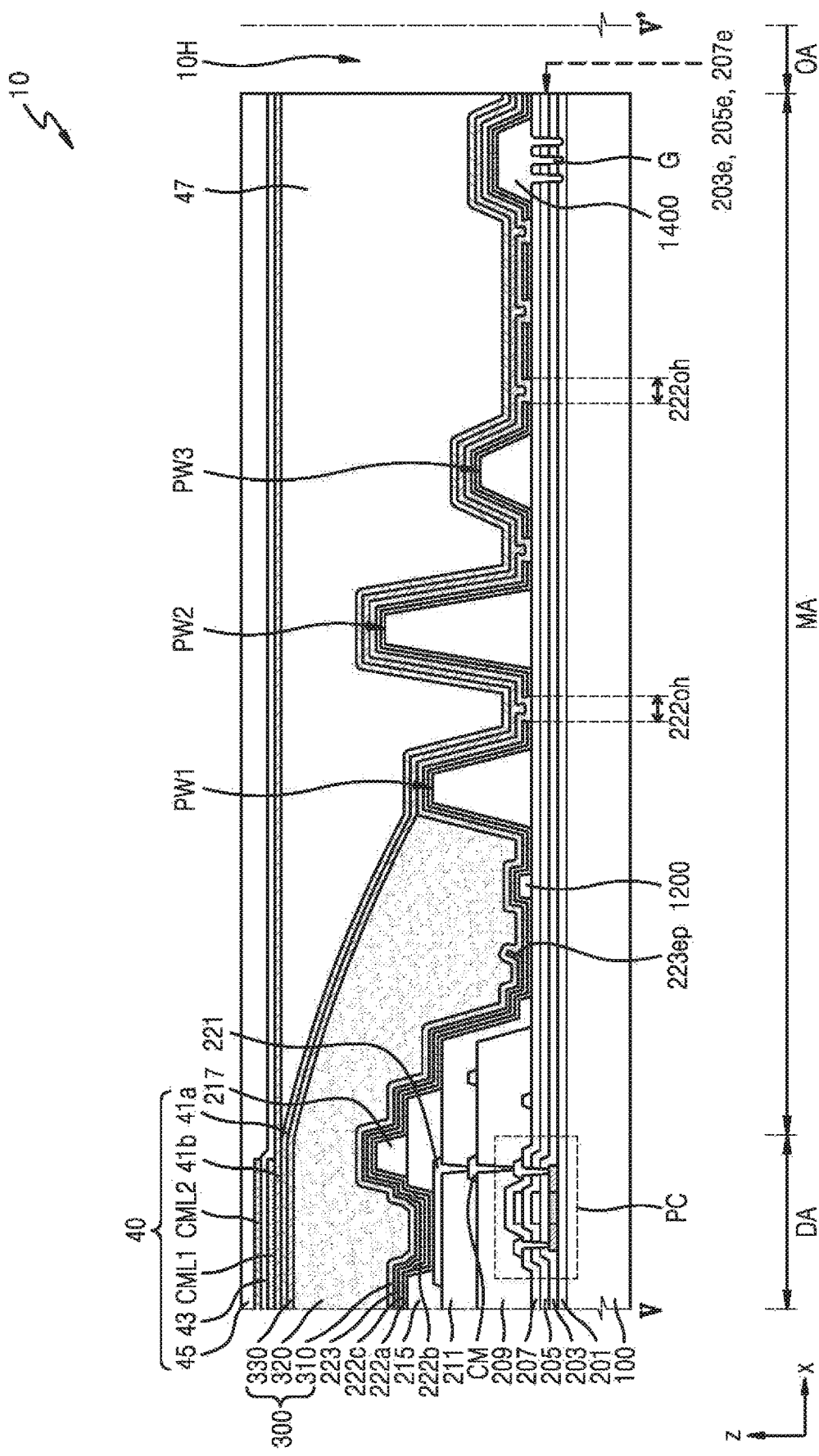
FIG. 14 is a cross-sectional view of a display panel according to an embodiment, taken along the line V-V of FIG. 5.

FIGS. 13 and 14 are cross-sectional views of the display panel 10 according to an embodiment, taken along the line V-V of FIG. 5.

According to the embodiment described above with reference to FIGS. 6A-12, it is shown that the edges 203e, 205e, and 207e of the gate insulating layer 203, the first interlayer insulating layer 205, and the second interlayer insulating layer 207 are arranged closer to the display area DA than the first partition wall PW1 is to the display area DA. In another embodiment, referring to FIGS. 13 and 14, like the buffer layer 201, the gate insulating layer 203, the first interlayer insulating layer 205, and/or the second interlayer insulating layer 207 may cover the entire top surface of the substrate 100. For example, the edges 203e, 205e, and 207e of the gate insulating layer 203, the first interlayer insulating layer 205, and the second interlayer insulating layer 207 may constitute the lateral surface of the display panel 10 that forms the opening 10H.

As described above, the organic layer 222o may include the second opening portion 222oh, and the second interlayer insulating layer 207 may be exposed through the second opening portion 222oh. The first inorganic encapsulation layer 310 may contact (e.g., directly contact) the top surface of the second interlayer insulating layer 207 through the second opening portion 222oh. The second interlayer insulating layer 207 may include an inorganic insulating material. In this case, the contact between the second interlayer insulating layer 207 and the first inorganic encapsulation layer 310 may block or reduce the progression of moisture.

Though it is shown in FIGS. 13 and 14 that the auxiliary layer 1200 overlaps the organic encapsulation layer 320, the display panel 10 may not include the auxiliary layer 1200 as shown in FIG. 11. Though it is shown in FIGS. 13 and 14 that the edge 320e of the organic encapsulation layer 320 is arranged on or at one side of the first partition wall PW1, the edge 320e of the organic encapsulation layer 320 may be arranged on the top surface of the first partition wall PW1, arranged on or at one side of the second partition wall PW2, or on the top surface of the second partition wall PW2 in another embodiment. Various suitable changes may be made according to one or more embodiments.

In an embodiment, as shown in FIG. 14, grooves G may be formed in a region that neighbors the opening 10H. The groove G may be formed in an inorganic insulating structure, for example, a stack structure including the gate insulating layer 203, the first interlayer insulating layer 205, and the second interlayer insulating layer 207. In an embodiment, the depth of the groove G may be less than a sum of the thicknesses of the buffer layer 201, the gate insulating layer 203, the first interlayer insulating layer 205, and the second interlayer insulating layer 207. In another embodiment, the groove G may be less than a sum of the thicknesses of the gate insulating layer 203, the first interlayer insulating layer 205, and the second interlayer insulating layer 207. In this case, the bottom surface of the groove G may be arranged on the top surface of the buffer layer 201. For example, the groove may extend partially into the buffer layer 201 as shown in FIG. 14.

A crack occurrence probability in an inorganic insulating material is greater than the crack occurrence probability in an organic insulating material. Accordingly, as the contact area of the gate insulating layer 203, the first interlayer insulating layer 205, and the second interlayer insulating layer 207 including an inorganic insulating material increases, there is a probability that a crack may occur and the occurring crack may propagate to surrounding areas. In contrast, in the case where the grooves G are formed and a cover layer 1400 including an organic insulating material is formed in the grooves G, the crack issue may be prevented or reduced. The groove G and the cover layer 1400 may have a closed-loop shape surrounding the opening area OA and the opening 10H in a view (e.g., in a plan view) in a direction perpendicular to the substrate 100 (e.g., the surface of the substrate 100).

Figure 15:
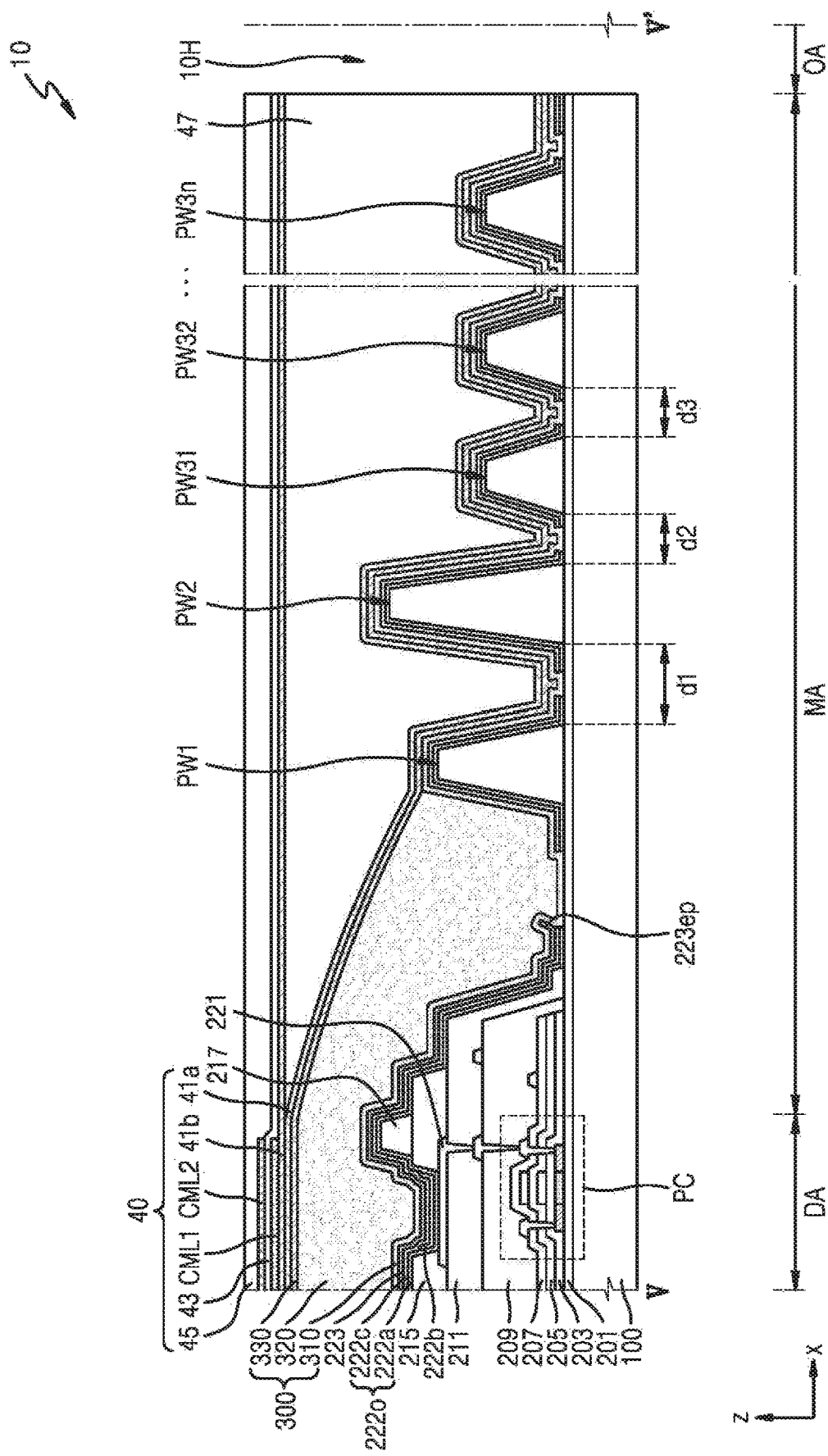
FIG. 15 is a cross-sectional view of a display panel according to an embodiment, taken along the line V-V of FIG. 5.

FIG. 15 is a cross-sectional view of the display panel 10 according to an embodiment, taken along the line V-V of FIG. 5.

According to the embodiment described above with reference to FIGS. 6A-14, though three partition walls are shown, the display panel 10 may include more than three partition walls as shown in FIG. 15 in another embodiment.

For example, the first partition wall PW1, the second partition wall PW2, and a plurality of third partition walls PW31, PW32, PW3n may be arranged and spaced from (e.g., spaced apart from) each other in a direction from the display area DA to the opening area OA.

The first partition wall PW1, the second partition wall PW2, and the plurality of third partition walls PW31, PW32, PW3n may be spaced from (e.g., spaced apart from) each other. A distance d1 between the first partition wall PW1 and the second partition wall PW2 neighboring each other (e.g., adjacent to each other) may be different from a distance d2 between the second partition wall PW2 and the (3-1)st partition wall PW31 neighboring each other (e.g., adjacent to each other). For example, the distance d1 between the first partition wall PW1 and the second partition wall PW2 may be greater than the distance d2 between the second partition wall PW2 and the (3-1)st partition wall PW31. A distance d3 between neighboring (e.g., adjacent) partition walls from among the plurality of third partition walls PW31, PW32, PW3n may be the same as or equal to the distance d2 between the second partition wall PW2 and the (3-1)st partition wall PW31.

Figure 16:
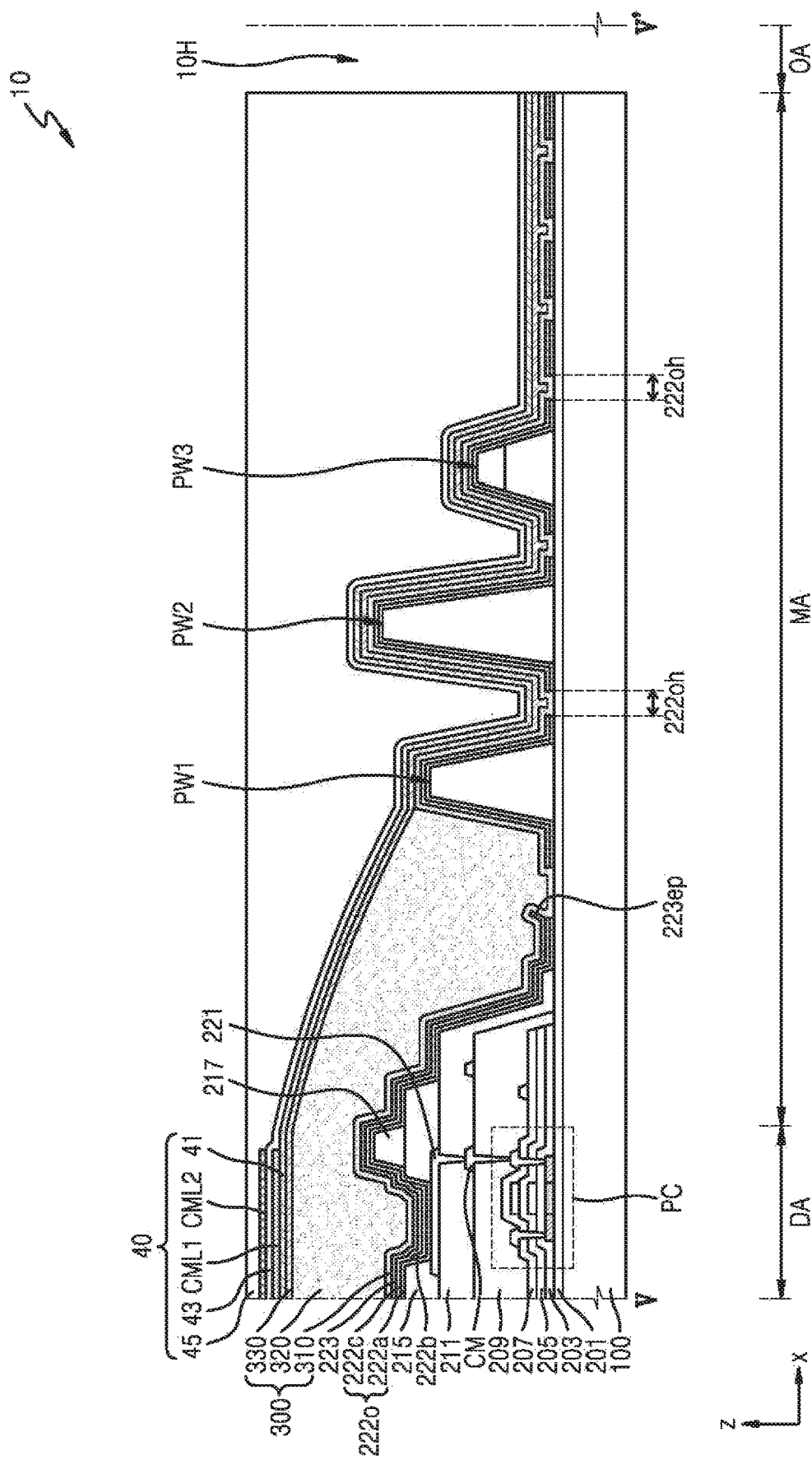
FIG. 16 is a cross-sectional view of a display panel according to an embodiment, taken along the line V-V of FIG. 5.

FIG. 16 is a cross-sectional view of the display panel 10 according to an embodiment, taken along the line V-V of FIG. 5.

According to the embodiment described above with reference to FIGS. 6A-15, it is shown that the planarization insulating layer 47 covers a region of the intermediate area MA that is not covered by the organic encapsulation layer 320 and the planarization insulating layer 47 is located only in the intermediate area MA, however, the present disclosure is not limited thereto.

In another embodiment, as shown in FIG. 16, the input sensing layer 40 may include a first insulating layer 41, a first conductive layer CML1, a second insulating layer 43, a second conductive layer CML2, and a third insulating layer 45 The third insulating layer 45 including an organic insulating material from among the insulating layers of the input-sensing layer 40 may cover a region of the intermediate area MA that is not covered by the organic encapsulation layer 320. In the case where the above structure is provided, unlike the embodiment described above, the planarization insulating layer 47 that is provided only in the intermediate area MA may be omitted. In this case, as shown in FIG. 16, portions of the third insulating layer 45, which is a planarization layer, may be respectively provided in a concave space between the partition walls, for example, a concave space between the first partition wall PW1 and the second partition wall PW2, and a concave space between the second partition wall PW2 and the third partition wall PW3.

Figure 17:
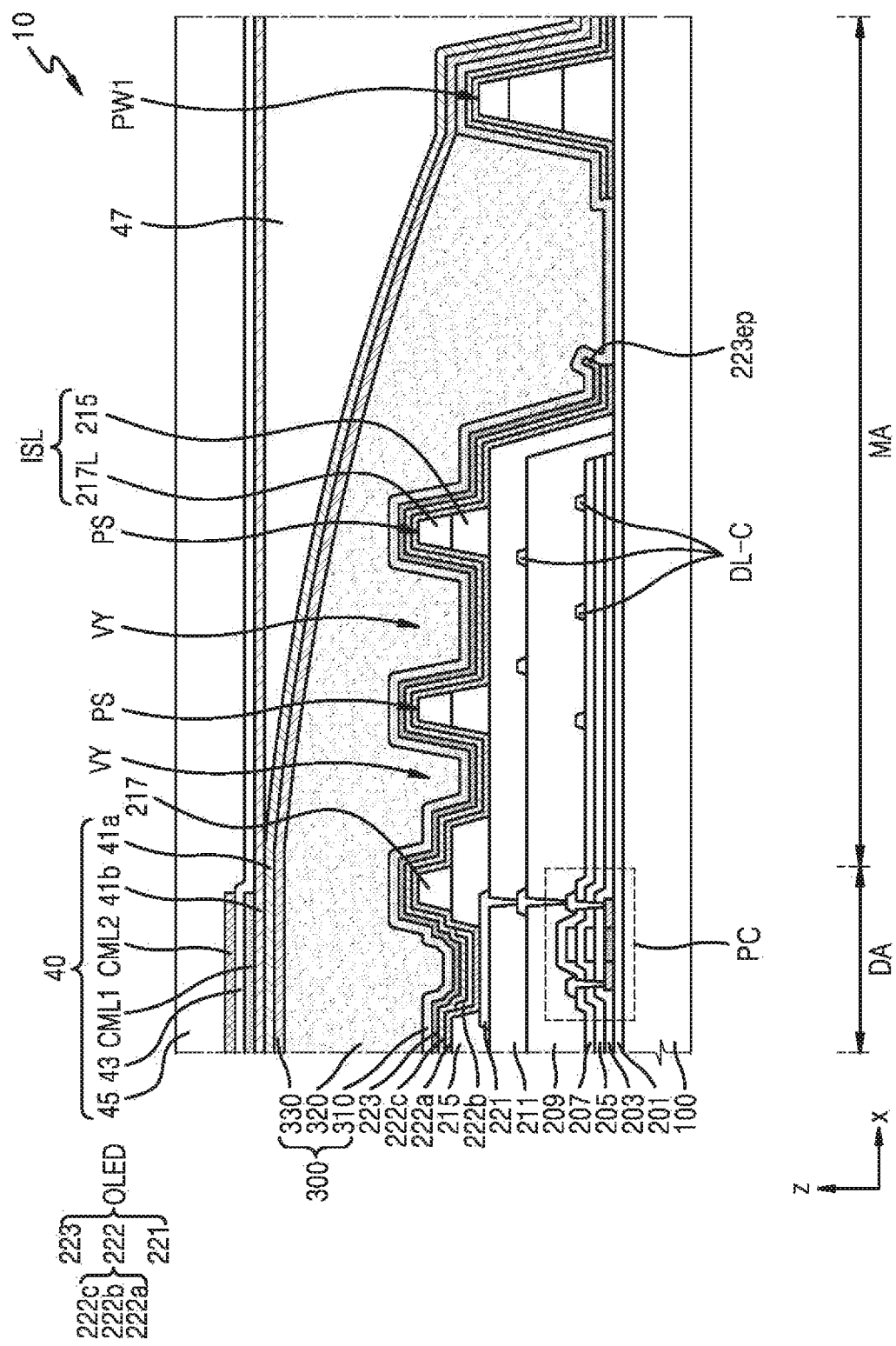
FIG. 17 is a cross-sectional view of a portion of a display area and a portion of an intermediate area of a display panel according to an embodiment.
Figure 18:
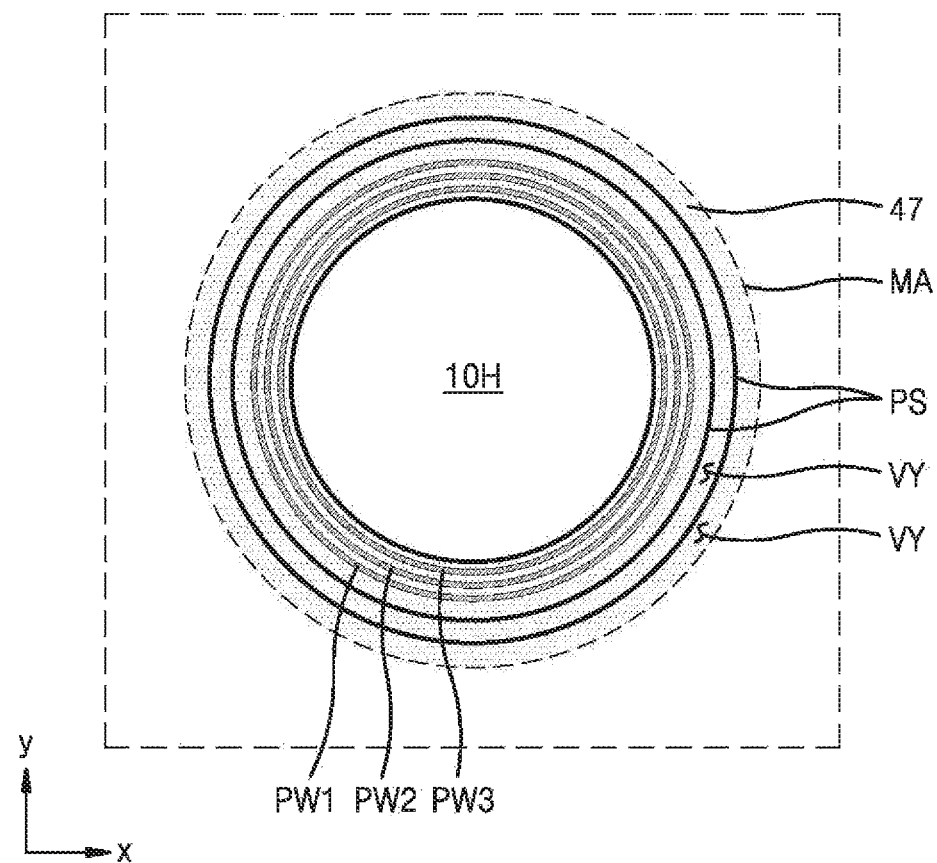
FIG. 18 is a plan view of a protrusion and a partition wall of FIG. 17.

FIG. 17 is a cross-sectional view of a portion of the display area DA and a portion of the intermediate area MA of the display panel 10 according to an embodiment, and FIG. 18 is a plan view of a protrusion and a partition wall of FIG. 17.

Referring to FIG. 17, as described above, the light-emitting diode, for example, an organic light-emitting diode OLED may be arranged in the display area DA, the insulating layers arranged below the organic light-emitting diode OLE ((e.g., the gate insulating layer 203, the first and second interlayer insulating layers 205 and 207, the first intermediate insulating layer 209, and the second intermediate insulating layer 211) may extend toward the intermediate area MA. Descriptions thereof may be the same as provided above with reference to FIGS. 6A-16, and therefore, redundant descriptions thereof may not be repeated.

A structure including a plurality of protrusions PS and a valley VY between neighboring (e.g., adjacent) protrusions PS may be formed on the insulating layers in the intermediate area MA. The structure including the protrusion PS and the valley VY may overlap detouring portions DL-C of the data lines. For example, at least one of the detouring portions DL-C of the data lines may overlap the protrusion PS and the valley VY.

The protrusions PS and the valleys VY may be alternately arranged in a horizontal direction (e.g., the x-direction) as shown in FIG. 17. For example, the valley VY may be arranged between neighboring (e.g., adjacent) protrusion PS, and the protrusion PS may be arranged between neighboring (e.g., adjacent) valleys VY. The structure including the protrusion PS and the valley VY may be formed from at least one insulating layer ISL on the second intermediate insulating layer 211, for example, a layer including the upper insulating layer 215 and the spacer 217 (217L).

A portion of the organic encapsulation layer 320 may be provided in a concave space corresponding to the valley VY, and the volume of the organic encapsulation layer 320 may be sufficiently secured through the valley structure. In a comparative example, when the valley structure is not provided, it may be difficult to sufficiently secure the thickness of the organic encapsulation layer 320 covering a region in which the detouring portions DL-C of the data lines are arranged through flowing of a monomer injected through an inkjet method. In contrast, according to the embodiment, the structure including the valley VY is formed, and thus, the volume of a monomer received in the valley VY may be improved, and accordingly, the thickness of the organic encapsulation layer 320 may be sufficiently secured. The valley VY and the protrusion PS may have a closed-loop shape surrounding the opening 10H of the display panel 10 in a plan view as shown in FIG. 18. Though FIGS. 17 and 18 show the planarization insulating layer 47 arranged in the intermediate area MA and having a closed-loop shape surrounding the opening 10H of the display panel 10, the third insulating layer 45 (e.g., see FIG. 16) may be arranged instead of the planarization insulating layer 47 as described with reference to FIG. 16 in another embodiment.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display panel comprising:
a substrate including an opening;
a plurality of light-emitting elements arranged in a display area around the opening, the plurality of light-emitting elements each comprising a first electrode, a second electrode, and an intermediate layer between the first electrode and the second electrode;
a plurality of partition walls arranged in an intermediate area between the display area and the opening; and
an encapsulation layer on the plurality of light-emitting elements, the encapsulation layer comprising an inorganic encapsulation layer and an organic encapsulation layer,
wherein the second electrode extends toward the intermediate area from the display area, and
wherein an organic layer of the intermediate layer includes a plurality of opening portions arranged in a region from the opening to an edge portion of the second electrode facing the opening, at least one of the plurality of opening portions being between adjacent ones of the partition walls, between the opening and one of the partition walls that is closest to the opening, or between the display area and one of the partition walls that is closest to the display area.

2. The display panel of claim 1, wherein the organic layer comprises organic portions that are separated from each other by the plurality of opening portions, and
wherein top surfaces of the organic portions contact the inorganic encapsulation layer.

3. The display panel of claim 1, wherein, in a plan view, each of the plurality of opening portions has a closed loop shape surrounding the opening.

4. The display panel of claim 1, wherein the organic layer comprises at least one of a hole transport layer, a hole injection layer, an electron transport layer, and an electron injection layer.

5. The display panel of claim 1, further comprising an inorganic insulating layer arranged over the substrate,
wherein the inorganic encapsulation layer contacts a top surface of the inorganic insulating layer through one of the plurality of opening portions.

6. The display panel of claim 1, wherein an edge of the organic encapsulation layer is adjacent to one of the plurality of partition walls, and
wherein the inorganic encapsulation layer comprises:
a first inorganic encapsulation layer under the organic encapsulation layer; and
a second inorganic encapsulation layer on the organic encapsulation layer, the second inorganic encapsulation layer contacting the first inorganic encapsulation layer in a region between the edge of the organic encapsulation layer and the opening.

7. The display panel of claim 1, wherein the edge portion of the second electrode is between the display area and one of the plurality of partition walls.

8. The display panel of claim 7, wherein the edge portion of the second electrode is covered by the organic encapsulation layer.

9. The display panel of claim 1, further comprising a plurality of inorganic insulating layers on the substrate,
wherein the plurality of inorganic insulating layers defines a plurality of grooves each having a depth less than a sum of thicknesses of the plurality of inorganic insulating layers, and
wherein the plurality of grooves overlaps a cover layer comprising an organic insulating material.

10. The display panel of claim 1, further comprising an auxiliary layer between the display area and one of the plurality of partition walls, the auxiliary layer overlapping the organic encapsulation layer.

11. The display panel of claim 10, wherein the auxiliary layer comprises a same material as the first electrode.

12. A display panel comprising:
a substrate including an opening;
a plurality of light-emitting elements arranged in a display area around the opening, the plurality of light-emitting elements each comprising a first electrode, a second electrode, and an intermediate layer between the first electrode and the second electrode;
a plurality of partition walls arranged in an intermediate area between the display area and the opening;
an encapsulation layer on the plurality of light-emitting elements, the encapsulation layer comprising an inorganic encapsulation layer and an organic encapsulation layer; and
a planarization layer on the encapsulation layer, the planarization layer overlapping the plurality of partition walls and a portion of the organic encapsulation layer,
wherein the second electrode extends toward the intermediate area from the display area, and
wherein an organic layer of the intermediate layer includes a plurality of opening portions arranged in a region from the opening to an edge portion of the second electrode facing the opening.

13. An electronic apparatus comprising:
a display panel comprising an opening area, a display area around the opening area, and an intermediate area between the opening area and the display area; and
a component overlapping the opening area,
wherein the display panel comprises:
a substrate including an opening arranged in the opening area;

a plurality of light-emitting elements arranged in the display area, each of the plurality of light-emitting elements comprising a first electrode, a second electrode, and an intermediate layer between the first electrode and the second electrode;

a plurality of partition walls arranged in the intermediate area; and an encapsulation layer arranged on the plurality of light-emitting elements, the encapsulation layer comprising a first inorganic encapsulation layer, an organic encapsulation layer, and a second inorganic encapsulation layer, wherein the second electrode extends toward the intermediate area from the display area, the second electrode including a first opening portion defined by an edge portion of the second electrode facing the opening, and wherein an organic layer of the intermediate layer comprises:
a plurality of second opening portions arranged in a region from the edge portion of the second electrode to the opening; and
a plurality of organic portions separated from each other by the plurality of second opening portions, the plurality of organic portions being arranged in the first opening portion.

14. The electronic apparatus of claim 13, wherein top surfaces of the plurality of organic portions contact the first inorganic encapsulation layer.

15. The electronic apparatus of claim 13, wherein, in a plan view, each of the plurality of second opening portions has a closed loop shape surrounding the opening.

16. The electronic apparatus of claim 13, wherein at least one of the plurality of second opening portions is arranged between two neighboring partition walls from among the plurality of partition walls.

17. The electronic apparatus of claim 13, wherein at least one of the plurality of second opening portions is arranged between the opening and a partition wall that is closest to the opening from among the plurality of partition walls.

18. The electronic apparatus of claim 13, wherein at least one of the plurality of second opening portions is arranged between the display area and a partition wall that is closest to the display area from among the plurality of partition walls.

19. The electronic apparatus of claim 13, wherein the organic layer comprises at least one of a hole transport layer, a hole injection layer, an electron transport layer, and an electron injection layer.

20. The electronic apparatus of claim 13, wherein the edge portion of the second electrode is covered by the organic encapsulation layer.

21. The electronic apparatus of claim 20, wherein an edge of the organic encapsulation layer is arranged between the edge portion of the second electrode and the opening.

22. The electronic apparatus of claim 13, wherein the display panel further comprises a plurality of inorganic insulating layers on the substrate,
wherein the plurality of inorganic insulating layers defines a plurality of grooves each having a depth less than a sum of thicknesses of the plurality of inorganic insulating layers, and
wherein the plurality of grooves overlaps a cover layer comprising an organic insulating material.

23. The electronic apparatus of claim 13, wherein the display panel further comprises an auxiliary layer between the display area and one of the plurality of partition walls, the auxiliary layer comprising a same material as the first electrode.

24. The electronic apparatus of claim 13, wherein the display panel further comprises a planarization layer on the encapsulation layer, overlapping the plurality of partition walls and a portion of the organic encapsulation layer, and comprising an organic insulating material.

25. The electronic apparatus of claim 13, wherein the component comprises a sensor or a camera.

* * * * *